United States Patent
Beninger-Bina et al.

(10) Patent No.: US 11,949,006 B2
(45) Date of Patent: Apr. 2, 2024

(54) POWER SEMICONDUCTOR DEVICE WITH P-CONTACT AND DOPED INSULATION BLOCKS DEFINING CONTACT HOLES

(71) Applicant: Infineon Technologies Dresden GmbH & Co. KG, Dresden (DE)

(72) Inventors: Markus Beninger-Bina, Grosshelfendorf (DE); Matteo Dainese, Munich (DE); Ingo Dirnstorfer, Dresden (DE); Erich Griebl, Dorfen (DE); Johannes Georg Laven, Taufkirchen (DE); Anton Mauder, Kolbermoor (DE); Hans-Joachim Schulze, Taufkirchen (DE)

(73) Assignee: Infineon Technologies Dresden GmbH & Co. KG, Dresden (DE)

( * ) Notice: Subject to any disclaimer, the term of this patent is extended or adjusted under 35 U.S.C. 154(b) by 405 days.

(21) Appl. No.: 17/325,710

(22) Filed: May 20, 2021

(65) Prior Publication Data
US 2021/0272843 A1   Sep. 2, 2021

Related U.S. Application Data

(62) Division of application No. 16/545,406, filed on Aug. 20, 2019, now Pat. No. 11,018,051.

(30) Foreign Application Priority Data

Aug. 22, 2018   (DE) .......................... 102018120432.9

(51) Int. Cl.
*H01L 29/739*   (2006.01)
*H01L 21/3115*   (2006.01)
(Continued)

(52) U.S. Cl.
CPC .... *H01L 29/7397* (2013.01); *H01L 21/31155* (2013.01); *H01L 21/32* (2013.01);
(Continued)

(58) Field of Classification Search
CPC .......... H01L 29/7397; H01L 21/31155; H01L 21/32; H01L 21/76816; H01L 29/66348; H01L 29/66674; H01L 29/7801
See application file for complete search history.

(56) References Cited

U.S. PATENT DOCUMENTS

| | | | |
|---|---|---|---|
| 6,051,468 | A | 4/2000 | Hshieh |
| 2001/0041407 | A1 | 11/2001 | Brown |

(Continued)

*Primary Examiner* — Michael Jung
(74) *Attorney, Agent, or Firm* — Murphy, Bilak & Homiller, PLLC

(57) ABSTRACT

A power semiconductor device includes: first and second trenches extending from a surface of a semiconductor body along a vertical direction and laterally confining a mesa region along a first lateral direction; source and body regions in the mesa region electrically connected to a first load terminal; and a first insulation layer having a plurality of insulation blocks, two of which laterally confine a contact hole. The first load terminal extends into the contact hole to contact the source and body regions at the mesa region surface. A first insulation block laterally overlaps with the first trench. A second insulation block laterally overlaps with the second trench. The first insulation block has a first lateral concentration profile of a first implantation material of the source region along the first lateral direction that is different from a corresponding second lateral concentration profile for the second insulation block.

20 Claims, 13 Drawing Sheets

(51) Int. Cl.
*H01L 21/32* (2006.01)
*H01L 21/768* (2006.01)
*H01L 29/66* (2006.01)
*H01L 29/78* (2006.01)

(52) U.S. Cl.
CPC .. *H01L 21/76816* (2013.01); *H01L 29/66348* (2013.01); *H01L 29/66674* (2013.01); *H01L 29/7801* (2013.01)

(56) References Cited

U.S. PATENT DOCUMENTS

| | | |
|---|---|---|
| 2002/0160573 A1 | 10/2002 | Peake et al. |
| 2003/0186507 A1 | 10/2003 | Henninger et al. |
| 2007/0032020 A1 | 2/2007 | Grebs et al. |
| 2008/0035990 A1 | 2/2008 | Matsuura et al. |
| 2013/0001684 A1* | 1/2013 | Hsieh ............... H01L 29/66734 257/334 |
| 2015/0041962 A1 | 2/2015 | Laven et al. |
| 2016/0086804 A1 | 3/2016 | Noguchi |
| 2016/0240642 A1* | 8/2016 | Schulze ............ H01L 29/1095 |
| 2018/0226480 A1* | 8/2018 | Okuda ............. H01L 21/26586 |

\* cited by examiner

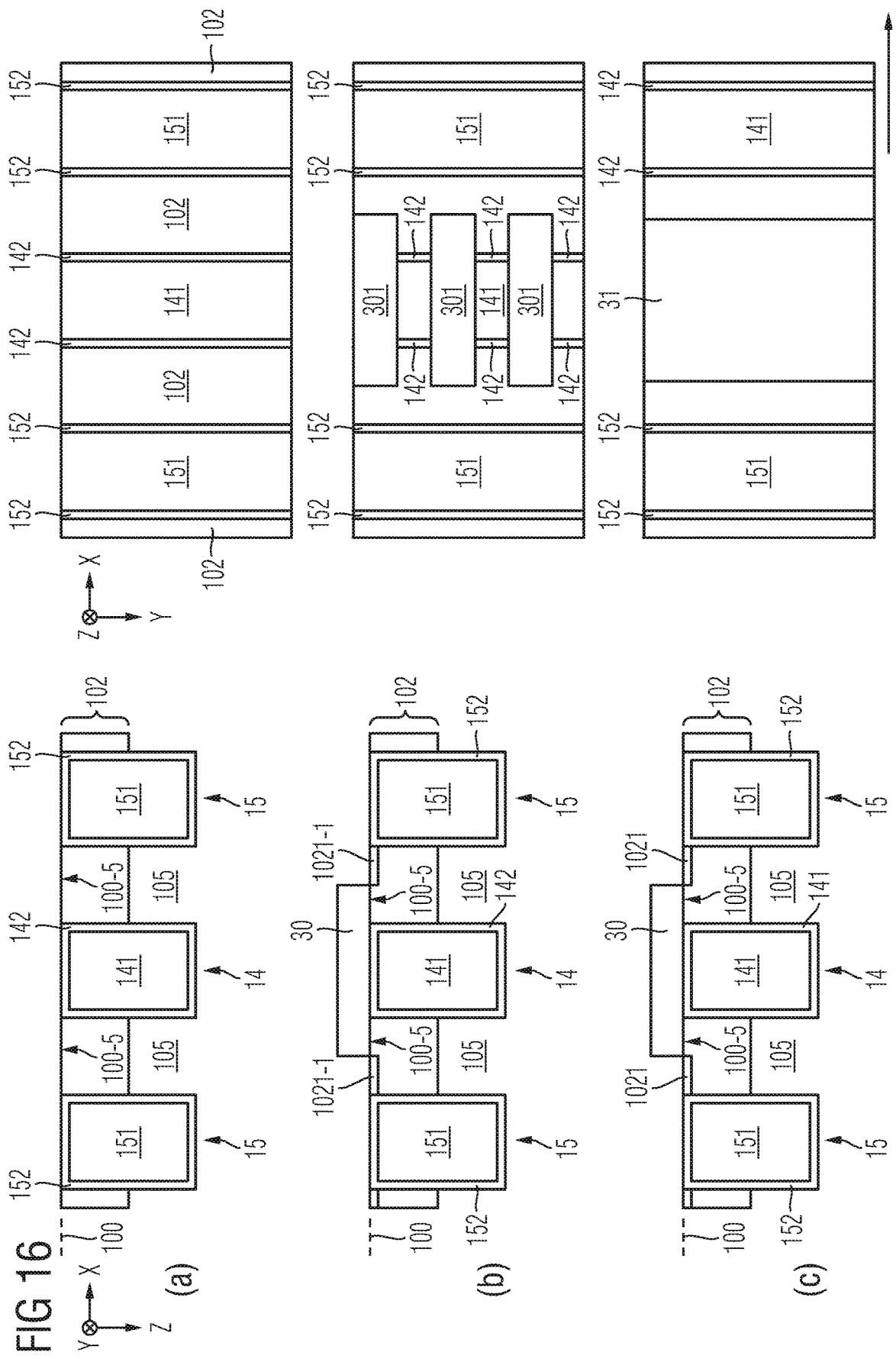

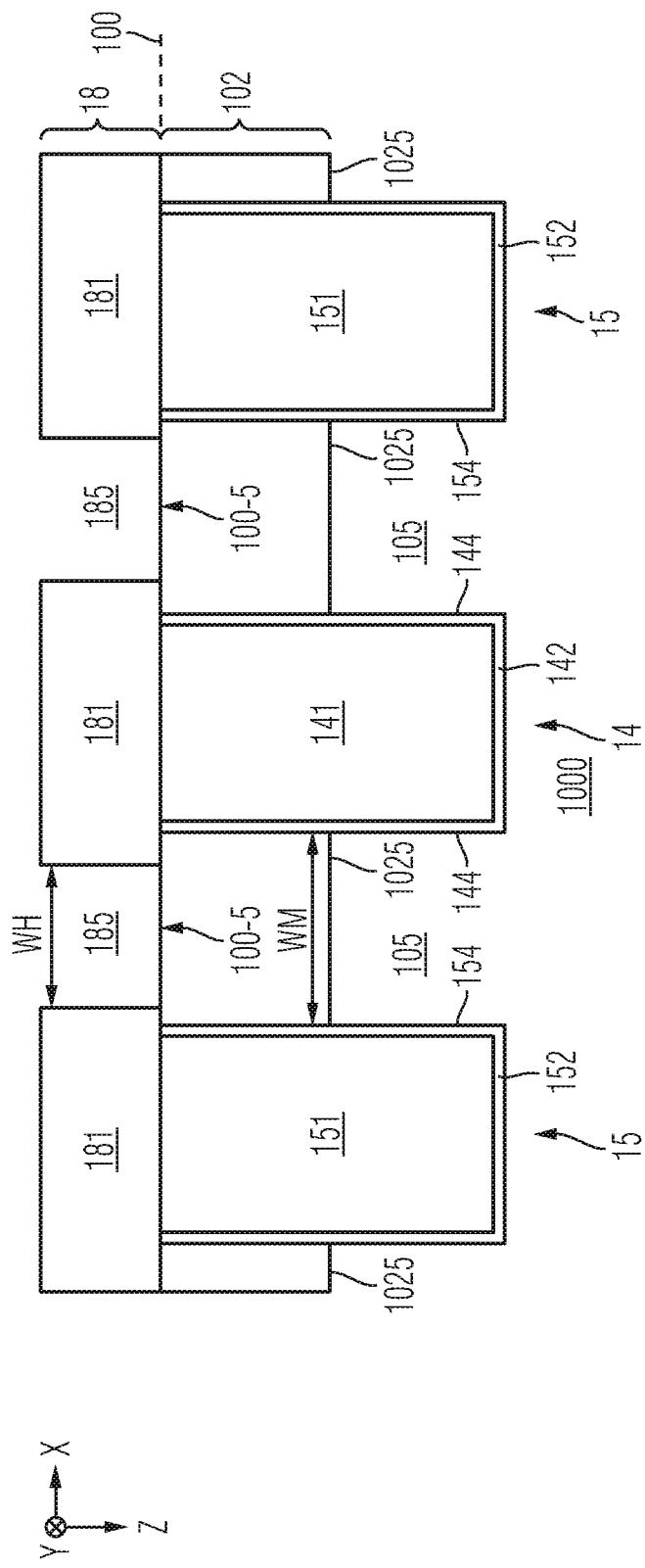

POWER SEMICONDUCTOR DEVICE WITH P-CONTACT AND DOPED INSULATION BLOCKS DEFINING CONTACT HOLES

TECHNICAL FIELD

This specification refers to embodiments of a power semiconductor device and to embodiments of a method of processing a power semiconductor device. In particular, this specification refers to aspects of a new body region formation process and to corresponding devices.

BACKGROUND

Many functions of modern devices in automotive, consumer and industrial applications, such as converting electrical energy and driving an electric motor or an electric machine, rely on power semiconductor switches. For example, Insulated Gate Bipolar Transistors (IGBTs), Metal Oxide Semiconductor Field Effect Transistors (MOSFETs) and diodes, to name a few, have been used for various applications including, but not limited to switches in power supplies and power converters.

A power semiconductor device usually comprises a semiconductor body configured to conduct a load current along a load current path between two load terminals of the device. Further, the load current path may be controlled by means of an insulated electrode, sometimes referred to as gate electrode. For example, upon receiving a corresponding control signal from, e.g., a driver unit, the control electrode may set the power semiconductor device in one of a conducting state and a blocking state. In some cases, the gate electrode may be included within a trench of the power semiconductor switch, wherein the trench may exhibit, e.g., a stripe configuration or a needle configuration.

It is usually desirable to keep losses, e.g., switching losses, on-state losses during a conducting state and off-state losses during a blocking state of the power semiconductor device low.

Further, a power semiconductor device shall usually exhibit a high reliability. To this end, it is desirable to check correct manufacturing and/or proper functionality of the device before shipping out to customers, and in particular to identify eventual errors that may have occurred during manufacturing. For example, those chips which are considered to exhibit a manufacturing error are excluded from shipping out to customers.

Checking the correct manufacturing of the device may occur at several stages. For example, at one stage, it may be checked whether the semiconductor source and body regions have been correctly formed within the semiconductor body and/or whether the semiconductor source and body regions are correctly connected to the load terminal of the device.

SUMMARY

Aspects described herein take into account the following consideration: Although checking the correct manufacturing of a power semiconductor device may occur at multiple stages during manufacturing, defects caused by a single defect, e.g., during the making of semiconductor source regions, can under circumstances not reliably be detected during or after manufacturing on the wafer level. Thus, it can be desirable to minimize the probability of occurrence of such a defect by virtue of the device design. For example, the manufacturing process can be modified such that two defects need to occur on the same spot on the wafer at two different times in the manufacturing process.

Further, aspects described herein relate to a new mesa region formation process that allows for at least one of an efficient check regarding the designated functionality of this region and a highly reliable implementation of the designated functionality of this region, in particular within the context of semiconductor devices having a pattern trench structure according to which trenches of different types (e.g. having different type of electrodes, such as source and gate electrodes) are arranged closely adjacent to each other on a regular basis. Such structure may for example be implemented to form high efficient MOSFETs or IGBTs, wherein said mesa region may include both a semiconductor source region and a semiconductor body region of complementary conductivity types and both connected to a source load terminal of the device.

According to an embodiment, a method of forming a power semiconductor device comprises: providing a semiconductor body having a surface; forming a plurality of trenches, the trenches extending from the surface along a vertical direction into the semiconductor body, wherein two trench sidewalls facing to each other of two adjacent ones of the trenches laterally confine a mesa region of the semiconductor body along a first lateral direction; forming a semiconductor body region of a second conductivity type in the mesa region, wherein a surface of the semiconductor body region in the mesa region at least partially forms the semiconductor body surface; forming a first insulation layer on the semiconductor body surface, the first insulation layer having at least one contact hole exposing at least a part of the mesa region surface; subjecting the semiconductor body region of the second conductivity type to a tilted source implantation using the at least one contact hole at least partially as a mask basis for forming a semiconductor source region of a first conductivity type in the mesa region, wherein the tilted source implantation is tilted from the vertical direction by an angle of at least 10°, and wherein the formed semiconductor source region extends for no more than 80% of the width of the mesa region along the first lateral direction.

According to another embodiment, a method of forming a power semiconductor device, comprises providing a semiconductor body having a surface; forming a plurality of trenches, the trenches extending from the surface along a vertical direction into the semiconductor body, wherein two trench sidewalls facing to each other of two adjacent ones of the trenches laterally confine a mesa region of the semiconductor body along a first lateral direction; forming a semiconductor body region of a second conductivity type in the mesa region, wherein a surface of the semiconductor body region in the mesa region at least partially forms the semiconductor body surface; forming a first insulation layer on the semiconductor body surface, the first insulation layer having at least one contact hole exposing at least a part the mesa region surface; forming a resist layer, the resist layer comprising at least one opening and at least one resist block, the at least one opening partially exposing the mesa region surface, and the at least one resist block partially covering the mesa region surface; subjecting the semiconductor body region of the second conductivity type to a source implantation along the vertical direction using the at least one contact hole and the at least one resist block at least partially as a mask basis for forming a semiconductor source region of a first conductivity type in the mesa region, wherein the formed semiconductor source region extends for no more than 80% of the width of the mesa region along the first lateral direction.

According to another embodiment, a power semiconductor device is presented. The semiconductor device comprises a semiconductor body, the semiconductor body being coupled to a first load terminal and a second load terminal and configured to conduct a load current between said terminals, wherein the power semiconductor device further comprises: a first trench and a second trench that extend from a surface of the semiconductor body along a vertical direction, wherein the trenches laterally confine a mesa region along a first lateral direction; a semiconductor source region of a first conductivity type and a semiconductor body region of a second conductivity type, both regions being arranged in the mesa region adjacent to a trench sidewall of the first trench and electrically connected to the first load terminal, wherein the semiconductor source region is based on a first implantation material, and wherein the first trench is configured for inducing an inversion channel in the body region to control a load current in the mesa region; a first insulation layer arranged above the semiconductor body surface and having a plurality of insulation blocks, two of which laterally confining a contact hole of the first insulation layer, wherein the first load terminal extends into the contact hole to contact both the semiconductor source region and the semiconductor body region at a surface of the mesa region, wherein a first of the two insulation blocks laterally overlaps with the first trench and a second of the two insulation blocks laterally overlaps with the second trench, the first insulation block having a first lateral concentration profile of the first implantation material along the first lateral direction that is different from a second lateral concentration profile of the first implantation material along the first lateral direction present in the second insulation block.

Those skilled in the art will recognize additional features and advantages upon reading the following detailed description, and upon viewing the accompanying drawings.

BRIEF DESCRIPTION OF THE DRAWINGS

The parts in the figures are not necessarily to scale, instead emphasis is being placed upon illustrating principles of the invention. Moreover, in the figures, like reference numerals designate corresponding parts. In the drawings:

FIG. 18 schematically and exemplarily illustrates a section of a vertical cross-section of a power semiconductor device at a stage of a semiconductor device processing method in accordance with one or more embodiments.

DETAILED DESCRIPTION

Figure 1:
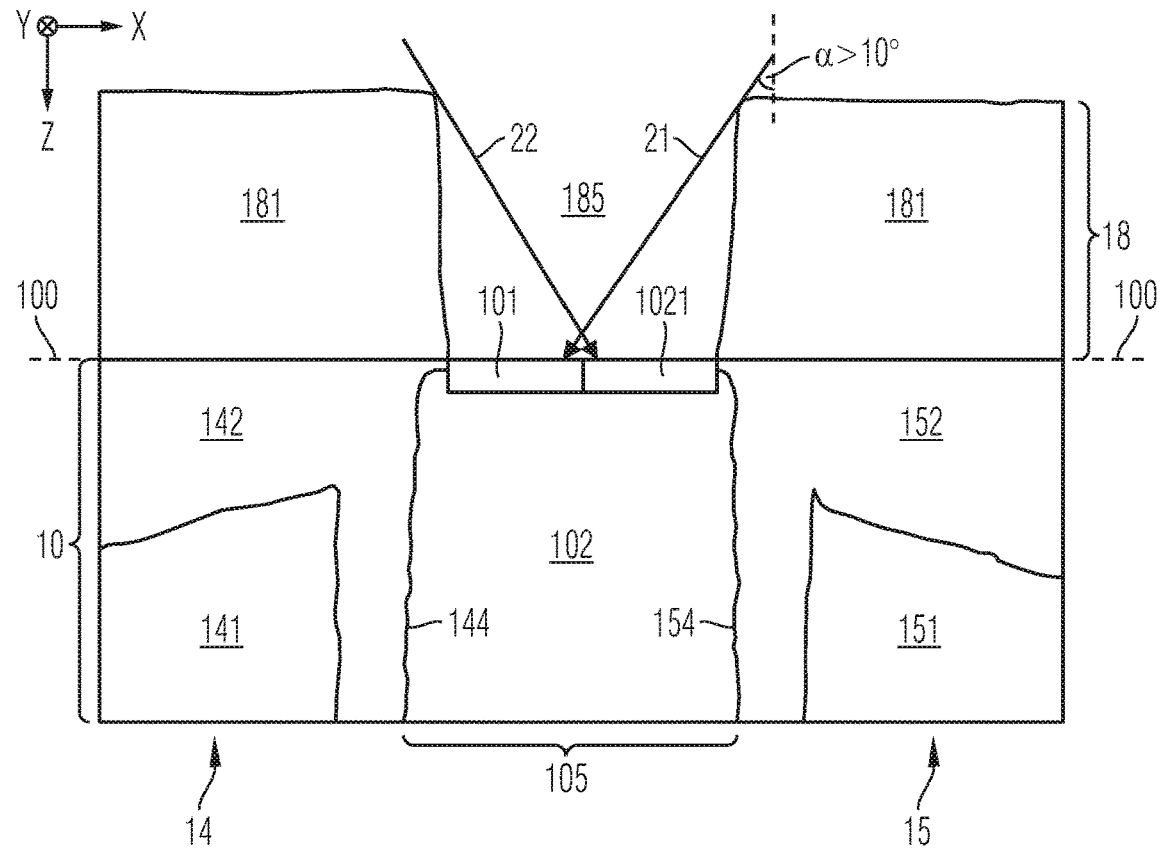
FIG. 1 schematically and exemplarily illustrates a section of a vertical cross-section of a power semiconductor device at a stage of a semiconductor device processing method in accordance with one or more embodiments.

In the following detailed description, reference is made to the accompanying drawings which form a part hereof and in which are shown by way of illustration specific embodiments in which the invention may be practiced.

In this regard, directional terminology, such as "top", "bottom", "below", "front", "behind", "back", "leading", "trailing", "above" etc., may be used with reference to the orientation of the figures being described. Because parts of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appended claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a horizontal surface of a semiconductor substrate or of a semiconductor structure. This can be for instance the surface of a semiconductor wafer or a die or a chip. For example, both the first lateral direction X and the second lateral direction Y mentioned below can be horizontal directions, wherein the first lateral direction X and the second lateral direction Y may be perpendicular to each other.

The term "vertical" as used in this specification intends to describe an orientation which is substantially arranged perpendicular to the horizontal surface, i.e., parallel to the normal direction of the surface of the semiconductor wafer/chip/die. For example, the extension direction Z mentioned below may be an extension direction that is perpendicular to both the first lateral direction X and the second lateral direction Y. The extension direction Z is also referred to as "vertical direction Z" herein.

In this specification, n-doped is referred to as "first conductivity type" while p-doped is referred to as "second conductivity type". Alternatively, opposite doping relations can be employed so that the first conductivity type can be p-doped and the second conductivity type can be n-doped.

In the context of the present specification, the terms "in ohmic contact", "in electric contact", "in ohmic connection", and "electrically connected" intend to describe that there is a low ohmic electric connection or low ohmic current path between two regions, sections, zones, portions or parts of a semiconductor device or between different terminals of one or more devices or between a terminal or a metallization or an electrode and a portion or part of a semiconductor device. Further, in the context of the present specification, the term "in contact" intends to describe that there is a direct physical connection between two elements of the respective semiconductor device; e.g., a transition between two elements being in contact with each other may not include a further intermediate element or the like.

In addition, in the context of the present specification, the term "electric insulation" is used, if not stated otherwise, in the context of its general valid understanding and thus intends to describe that two or more components are positioned separately from each other and that there is no ohmic connection connecting those components. However, components being electrically insulated from each other may nevertheless be coupled to each other, for example mechanically coupled and/or capacitively coupled and/or inductively coupled. To give an example, two electrodes of a capacitor may be electrically insulated from each other and, at the same time, mechanically and capacitively coupled to each other, e.g., by means of an insulation, e.g., a dielectric.

Specific embodiments described in this specification pertain to, without being limited thereto, a power semiconductor switch exhibiting a stripe cell or cellular cell configuration, e.g., a power semiconductor device that may be used within a power converter or a power supply. Thus, in an embodiment, such device can be configured to carry a load current that is to be fed to a load and/or, respectively, that is provided by a power source. For example, the power semiconductor device may comprise one or more active power semiconductor cells, such as a monolithically integrated diode cell, e.g., a monolithically integrated cell of two antiserially connected diodes, a monolithically integrated transistor cell, e.g., a monolithically integrated IGBT cell and/or derivatives thereof. Such diode/transistor cells may be integrated in a power semiconductor module. A plurality of such cells may constitute a cell field that is arranged with an active region of the power semiconductor device.

The term "power semiconductor device" as used in this specification intends to describe a semiconductor device on a single chip with high voltage blocking and/or high current-carrying capabilities. In other words, such power semiconductor device is intended for high current, typically in the Ampere range, e.g., up to several ten or hundred Ampere, and/or high voltages, typically above 15 V, more typically 100 V and above, e.g., up to at least 400 V or even more, e.g., up to at least 3 kV, or even up to 10 kV or more.

For example, the power semiconductor device described below may be a semiconductor device exhibiting a stripe cell configuration or a cellular (columnar/needle) cell configuration and can be configured to be employed as a power component in a low-, medium- and/or high voltage application.

For example, the term "power semiconductor device" as used in this specification is not directed to logic semiconductor devices that are used for, e.g., storing data, computing data and/or other types of semiconductor-based data processing.

Figure 17A:
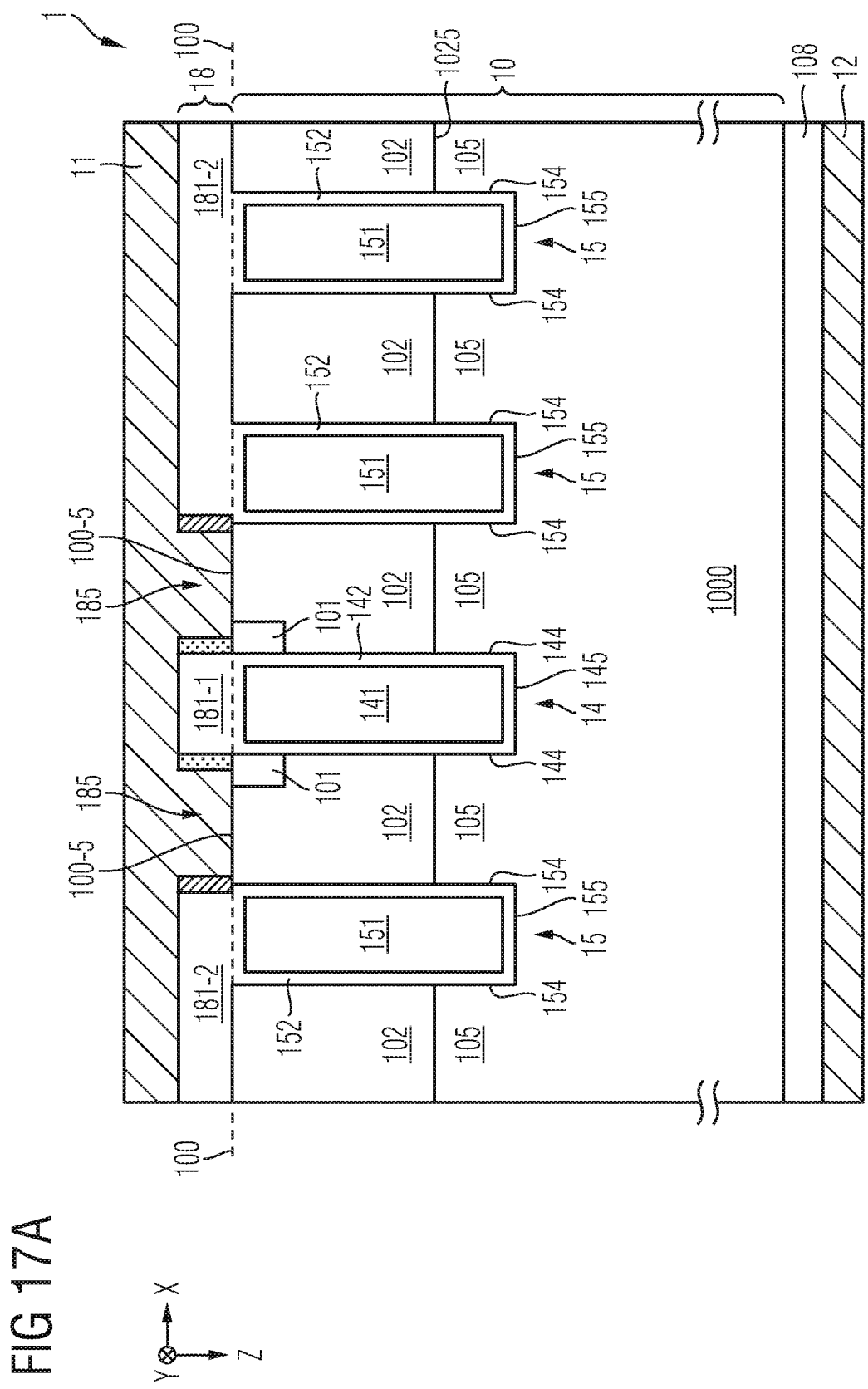
FIG. 17A-17B each schematically and exemplarily illustrate a section of a vertical cross-section of a power semiconductor device in accordance with one or more embodiments.
Figure 17B:
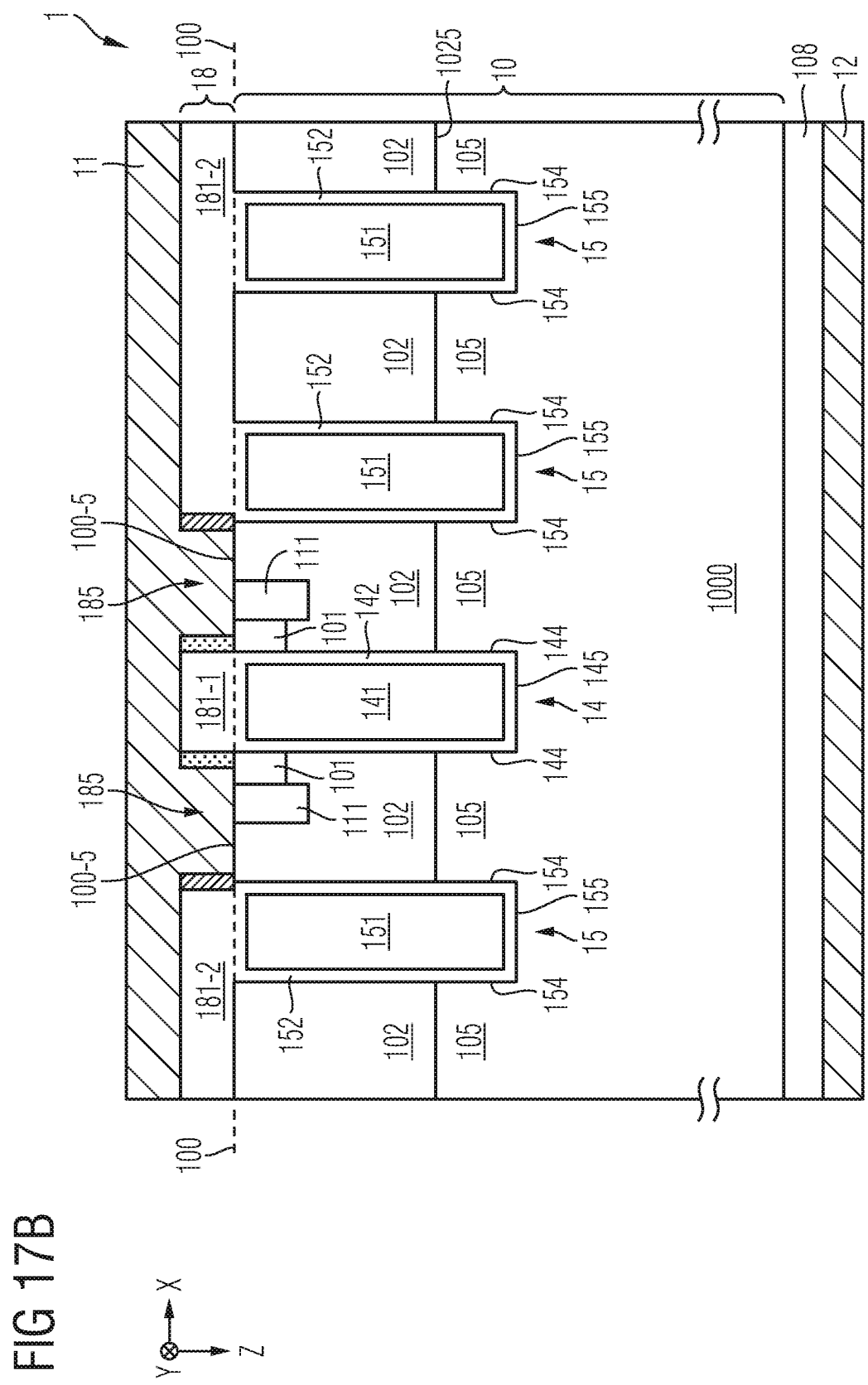

Each of FIG. 17A-B schematically and exemplarily illustrates a power semiconductor device 1 in accordance with one or more embodiments. In the following, it will be referred to both of FIGS. 17A and 17B.

The power semiconductor device 1 has a semiconductor body 10, the semiconductor body 10 being coupled to a first load terminal 11 and a second load terminal 12 and configured to conduct a load current between said terminals 11, 12.

For example, the power semiconductor device 1 has a MOSFET configuration or an IGBT configuration or an RC-IGBT configuration or a configuration derived from one of these basic power semiconductor device configurations, such as an RC-IGBT with diode control (RCDC) configuration. Hence, the first load terminal 11 can be a source terminal or an emitter terminal, and the second load terminal 12 can be a drain terminal or a collector terminal.

The power semiconductor device 1 may have a vertical configuration, according to which the semiconductor body 10 is sandwiched between the first load terminal 11 and the second load terminal 12, and according to which the load current flows in a direction essentially in parallel to the vertical direction Z.

Depending on the configuration of the power semiconductor device 1, the semiconductor body 10 is provided with a plurality of doped regions.

For example, the main part of the semiconductor body 10 is formed by a drift region 1000 of the first conductivity type, wherein the dopant concentration of the drift region 1000 is rather low.

The drift region 1000 may be coupled to the second load terminal 12 by means of a first doped region 108, which may comprise a first emitter region of the second conductivity type arranged in electrical contact with the second load terminal 12, e.g., in case of an IGBT configuration. In addition, the first doped region 108 may comprise second emitter regions of the first conductivity type that are also arranged in electrical contact with a second load terminal 12, e.g., so as to provide an RC-IGBT configuration. In addition to at least one of the first emitter region and the second emitter regions, the first contact region 108 may comprise a field stop region of the first conductivity type, wherein the field stop region may have higher dopant concentration of dopants of the first conductivity type as compared to the drift region. In another embodiment, the first doped region 108 is entirely a region of the first conductivity type, e.g. in case of a MOSFET configuration. In the context of IGBTs, RC-IGBTs and MOSFETs, the general functionality and configuration of the first doped region 108 is known to the skilled person, and in accordance with the embodiments described herein, is not deviated from this general functionality and configuration of the first doped region 108.

In the section of the semiconductor body 10 that interfaces with the first load terminal 11, a plurality of power cells may be formed. For example, the power semiconductor device 1 includes a plurality of equally configured power cells, e.g., at least 10, 100, or 1000 power cells, or at least 10,000 power cells or even more than 100,000 power cells.

For example, each power cell includes a plurality of trenches, e.g., at least one or more first trenches 14 and at least one or more second trenches 15, each extending from a surface 100 of the semiconductor body 10 along the vertical direction Z, wherein the trenches 14 and 15 laterally confine mesa regions 105 along the first lateral direction X.

The trenches 14 and 15 may exhibit a stripe configuration according to which the lateral extension along the second lateral direction Y is significantly larger than the total extension along first lateral direction X, i.e., significantly larger than the trench width. In an embodiment, the trenches of the power cells each exhibit the same trench width (in the first lateral direction X), the same trench depth (in the vertical direction Z) and are spatially displaced from each other along the first lateral direction X according to a fixed pattern.

The trench width may be defined as the distance between the two trench sidewalls 144 (154, respectively) of each trench 14 (15, respectively), and the trench depth may be defined as a distance between the semiconductor body surface 100 and the trench bottom 145 (155, respectively).

Each trench 14, 15 may comprise a respective trench electrode 141, 151 and a respective trench insulator 142, 152 insulating the trench electrodes 141, 152 from the semiconductor body 10.

The above mentioned plurality of doped regions of the semiconductor body 10 may include a semiconductor source region 101 of the first conductivity type and a semiconductor body region 102 of the second conductivity type, both regions 101, 102 being arranged in at least one of the mesa regions 105 adjacent to the trench sidewall 144 of the first trench 14 and electrically connected to the first load terminal 11.

The semiconductor source region 101 typically, but not necessarily, exhibits a significantly greater dopant concentration as compared to the drift region 1000. The source region 101 is arranged in electrical contact with the first load terminal 11. For example, the semiconductor source region 101 forms a part of the surface 100-5 of the mesa region 105 that interfaces with the first load terminal 11. The first trench 14 may have semiconductor source regions 101 arranged adjacent to both of its trench sidewalls 144, or only one semiconductor source region 101 arranged adjacent to only one of its trench sidewalls 144, which will become more apparent from the subsequent description.

The semiconductor body region 102 (of the second conductivity type) typically, but not necessarily, exhibits a significantly greater dopant concentration as compared to the drift region 1000, wherein the dopant concentration of the body region 102 may vary. For example, in a subsection of the body region 102 that interfaces with the first load terminal 11 may be stronger doped as compared to another subsection of the body region 102, as will be explained in more detail below. The body region is arranged in electrical contact with the first load terminal 11. For example, the semiconductor body region 102 also forms a part of the surface 100-5 of the mesa region 105 that interfaces with the first load terminal 11. For example, the section of the semiconductor body region 102 that interfaces with the first load terminal 11 has a comparatively high dopant concentration as compared to the remaining part of the semiconductor body region 102.

The semiconductor body region 102 may extend throughout the entire width of the mesa region 105, as illustrated. The semiconductor body region 102 isolates the semiconductor source region 101 from the semiconductor drift region 1000. A transition between the semiconductor body region 102 and the drift region 1000 forms the pn-junction 1025, wherein the pn-junction 1025 can be arranged within the mesa regions 105.

The first trench 14 is configured for inducing an inversion channel in the body region 102, e.g., in a subsection typically called channel region, to control a load current in the mesa region 105. For example, the inversion channel is formed in the channel region of the body region 102, wherein the channel region may be arranged adjacent to the trench sidewall 144 and may extend below the semiconductor source region 101.

By controlling the load current in each of the mesa regions 105 which have a configuration as just described (in particular: both said source and body regions electrically connected to the first load terminal 11), the load current of the power semiconductor device 1 can be controlled. For example, the trench electrode 141 of the first trench 14 is a gate electrode which receives, from a driver (not illustrated), a gate signal, e.g. formed by applying a voltage between a gate terminal (not illustrated) and the first load terminal 11, wherein the gate terminal may be electrically connected to the trench electrodes 141 of the first trenches 14.

Configurations of pn-isolations within mesa regions laterally confined by trenches, as described above, are known to the skilled person in the context of IGBTs, RC-IGBTs and MOSFETs, and in accordance with the embodiments described herein, is not deviated from this general functionality and configuration of such pn-isolations.

Each power cell of the power semiconductor device 1 may comprise more than only one mesa region 105, for example at least two or three or four mesa regions 105 or even more than for mesa regions 105, and a corresponding number of trenches. However, it shall be understood that not each mesa region 105 of a respective one of the power cells must be configured for conducting the load current. Rather, in accordance with some embodiments, one or more of the mesa regions 105 of the respective one of the power cells is not configured for conducting the load current, wherein such configuration may be achieved in different ways. For example, the mesa region 105 is not configured for load current conduction if not electrically connected to the first load terminal, as the exemplary mesa region 105 between the two second trenches 15 in FIG. 17A/B. Additionally or alternatively, the mesa region 105 is not configured for load current conduction if not equipped with a source region.

Further, with exemplary respect to the two mesa regions 105 arranged adjacent to the first trench 14 illustrated in FIG. 17A/B, it shall be understood that along the second lateral direction Y, the mesa region 105 may change its configuration regarding capability of conducting the load current or not. For example, this can be achieved by structuring the semiconductor source region 101 along the second lateral direction Y, which will become more apparent from other drawings explained further below.

At least one of the second trenches 15, e.g., the second trench 15 adjacent to the mesa region 105 including the source region 101, can be a source trench whose trench electrode 151 is electrically connected or at least electrically coupled to the first load terminal 11.

One or more of the other second trenches 15 can, but must not necessarily be different from both a source trench and a gate trench. For example, further trench types may be provided for forming the power cells, e.g., trenches with electrically floating electrodes, trenches that have gate electrodes that are not arranged adjacent to semiconductor source region (so-called dummy gate trenches, herein also referred to as third trench 16, cf. FIG. 8) and the like.

Hence, in view of the explanation above regarding the different configurations of the mesa regions and the trenches, the power cells of the semiconductor device 1 may be configured in accordance with various so-called contacting schemes, i.e., schemes that define what type of trench is arranged adjacent to what type of mesa region. However, in the context of IGBTs, RC-IGBTs and MOSFETs, a plurality of different contacting schemes are known to the skilled person, and the embodiments described herein are not limited to specific contacting schemes, the contacting scheme for example illustrated in FIG. 17A/B being only exemplary.

For example, in accordance with the embodiments described herein, the load current conducting mesa region 105 is neighbored by the first trench 14 implemented as a gate trench and by the second trench 15 implemented as a source trench. If included, the further second trenches 15 of each power cell may include one or more of a dummy gate trench, a source trench and a floating trench.

The semiconductor body surface 100 may be covered by a first insulation layer 18 that has contact hole 185 so as to allow an electrical connection between the first load terminal 11 and at least some of the mesa regions 105. The contact holes 185 are formed by respective two adjacent insulation blocks, namely for example a first insulation block 181-1 above the first trench 14, and two second insulation blocks 181-2 above the second trenches 15.

It shall be understood that the term "block" as used herein does not imply any limitations regarding the geometrical shape of the insulation (or resist, cf. below) blocks referred to. Rather, the blocks referred to may, for example, be elements of a laterally structured layer that appear as "blocks" in the illustrated cross-sections.

The first insulation layer 18 can comprise or be composed of various electrically insulating materials, e.g., mainly oxides. For example, the first insulation layer 18 can comprise or be composed an oxide and/or a low-k dielectric material. Further, the first insulation layer 18 may exhibit a thickness along the vertical direction Z of at least 200 nm, or of at least 400 nm, or of at least 450 nm. The first insulation layer 18 may comprise a plurality of (non-illustrated) insulating sublayers, e.g., a TEOS (tetraethyl orthosilicate) or a spin on glass (e.g. BPSG, Boron Phosphorus Silicate Glass) or another silicate glass sublayer. The first insulation layer 18 can be made of a plurality of different insulating materials, or of only one insulating material.

In an embodiment, the first insulation layer 18 is not an auxiliary layer that would be removed during the device processing methods; rather, the first insulation layer 18 remains a part of the device, even during later operation of the device. For example, the first insulation layer 18 is covered directly or indirectly with an electrically conductive material, e.g., a metal, used for forming the first load terminal 11 (wherein the first insulation layer 18 may be covered with an additional insulation layer before depositing the electrically conductive material).

The first insulation layer 18 is arranged above the semiconductor body surface 100 and may have a plurality of said insulation blocks 181, two of which laterally confining said at least one contact hole 185 of the first insulation layer 18, wherein the first load terminal 11 extends into the contact hole 185 to contact both the semiconductor source region 101 and the semiconductor body region 102 at the surface 100-5 of the mesa region 105. For example, the first insulation block 181-1 laterally overlaps with the first trench 14 and the second insulation block 181-2 laterally overlaps with the second trench 15.

In an embodiment, a width along the first lateral direction X of the part of the mesa region surface 100-5 exposed by the at least one contact hole 185 (e.g., the width of the contact hole 185) is within the range of 50 nm to 2 μm, for example in the range of 50 nm to 250 nm or 250 nm to 550 nm or even 1 μm to 2 μm. The width may depend on the blocking voltage rating and/or the load current capability of the power semiconductor device 1.

For example, as illustrated in FIG. 17A, the electrical contact between the first load terminal 11 and the mesa region 105 can be realized as a flat contact which can be essentially arranged co-planarily with the semiconductor body surface 100.

In another embodiment, as schematically and exemplarily illustrated in FIG. 17B, the electrical contact between the first load terminal 11 and the mesa region 105 can be realized by employing a contact groove 111 that extends from the level of the semiconductor body surface 100 along the vertical direction Z into the mesa region 105. For example, such contact grooves 111 may be etched into the semiconductor body 10 and later be filled with an electrically conductive material.

If implemented, the contact groove 111 may extend further into the semiconductor body 10 along the vertical direction Z than the source region 101. The contact groove 111 may be etched, e.g., before or after forming the source region 101 by means of implantation, as described further below.

The semiconductor source region 101 can be based on a first implantation material or a group of first implantation materials. The semiconductor body region 102 can be based on a second implantation material or a group of second implantation materials. Hence, for forming the semiconductor source region 101 and the semiconductor body region 102, one or more implantation processing steps may be carried out. The implantation processing steps may be combined with one or more thermal diffusion steps (herein also referred to as thermal annealing steps).

Aspects described herein relate to forming the mesa region 105 including the semiconductor source region 101 and the semiconductor body region 102 by means of at least one implantation processing step in a way that allows more reliably achieving a proper electrical contact between the first load terminal 11 and the mesa region 105 or, respectively, in a way that at least allows a more reliable verification of a proper electrical contact between the first load terminal 11 and the mesa region 105.

For example, according to an embodiment, a method of forming a power semiconductor device comprises: providing a semiconductor body having a surface; forming a plurality of trenches, the trenches extending from the surface along a vertical direction into the semiconductor body, wherein two trench sidewalls facing to each other of two adjacent ones of the trenches laterally confine a mesa region of the semiconductor body along a first lateral direction; forming a semiconductor body region of a second conductivity type in the mesa region, wherein a surface of the semiconductor body region in the mesa region at least partially forms the semiconductor body surface; forming a first insulation layer on the semiconductor body surface, the first insulation layer having at least one contact hole exposing at least a part of the mesa region surface; subjecting the semiconductor body region of the second conductivity type to a tilted source implantation using the at least one contact hole at least partially as a mask basis for forming a semiconductor source region of a first conductivity type in the mesa region, wherein the tilted source implantation is tilted from the vertical direction by an angle of at least 10°, and wherein the formed semiconductor source region extends for no more than 80% of the width of the mesa region along the first lateral direction.

For example, now referring to FIG. 1, providing the semiconductor body 10 having the surface 100, and forming the plurality of trenches 14, 15 may occur in the usual manner known to skilled person. The semiconductor body 10 can be provided as a part of a semiconductor wafer, and the trenches 14, 15 may be formed by carrying out, for example, an etch processing step and a subsequent oxidation processing step for forming the trench insulators 142,152 and a subsequent deposition processing step for forming the trench electrodes 141, 151. This may be followed by another processing step to recess the trench electrodes 141, 151 inside the respective trench 14, 15 and form a further portion of the trench insulator 142, 152 on the recessed trench electrodes 141, 151.

Forming the semiconductor body region 102 of the second conductivity type in the mesa region 105 may also involve standard processes known to skilled person, such as a first blanket (i.e., not masked with respect to the mesa regions) implantation processing step.

Optional features of forming the semiconductor body region 102 will be explained in more detail below. Irrespective of how the semiconductor body region 102 is formed, in accordance with some or all embodiments described herein and, before carrying out the next processing steps, it can be ensured that the surface of the semiconductor body region 102 in the mesa region 105 forms, at least partially or entirely, the mesa region surface 100-5. Further, it shall be noted that after it has been ensured that the mesa region surface 100-5 is formed, partially or entirely, by the semiconductor body region 102 of the second conductivity type, further processing steps may be carried out at a later stage to further modify the body region 102, e.g., by carrying out a masked or unmasked contact implantation so as to provide for a high dopant concentration of the body region 102 in a section that later interfaces with the first load terminal 11 or, respectively, with said contact groove 111.

As indicated above, the first insulation layer 18 is formed on the semiconductor body surface 100, wherein the first insulation layer 18 has the at least one contact hole 185 exposing, partially or entirely, the mesa region surface 100-5 formed, partially or entirely, by the body region 102.

Also, forming the first insulation layer 18 can be carried out in accordance with standard processes known to the skilled person (including, e.g., deposition and/or thermal oxidation processing steps). For example, the first insulation layer 18 can be or, respectively, comprise a dielectric interlayer.

As already indicated above, the first insulation layer 18 can comprise or be composed of various electrically insulating materials, e.g., mainly oxides. For example, the first insulation layer 18 can comprise or be composed an oxide and/or a low-k dielectric material. Further, the first insulation layer 18 may exhibit a thickness along the vertical direction Z of at least 200 nm, or of at least 400 nm, or of at least 450 nm. The first insulation layer 18 may comprise a plurality of (non-illustrated) insulating sublayers, e.g., a TEOS or a spin on glass (e.g. BPSG) or another silicate glass sublayer. The first insulation layer 18 can be made of a plurality of different insulating materials, or of only one insulating material.

After the first insulation layer 18 has been formed, the semiconductor body region 102 of the second conductivity type is subjected to a tilted source implantation 21 using the at least one contact hole 185 at least partially as a mask basis for forming the semiconductor source region 101 of the first conductivity type in the mesa region 105, wherein the tilted source implantation 21 is tilted from the vertical direction Z by an angle of at least 10°, as indicated in FIG. 1. This tilting angle can be even greater than 10°, e.g., greater than 20° or even greater than 45°. Further, the spatial extension area of the semiconductor source region 101 may enlarge after an optional temperature annealing processing step, e.g., such that the source region 101 and the trench electrode 141 of the first trench 14 have a common extension range along the vertical direction Z.

Further, it shall be understood that the formulation "using the at least one contact hole 185 at least partially as a mask basis" may imply that elements of the first insulation layer 18, e.g., one or more insulation blocks 181, e.g., one or both of said first insulation block 181-1 and said second insulation block 181-2 are used at least partially as a mask basis, wherein said at least one insulation block 181, 181-1 or 182-2 laterally confines the at least one contact hole 185.

As illustrated, the contact hole 185 or, respectively, at least one of the blocks 181 laterally confining the contact hole, can even serve as the mask itself, and not only as a mask basis. In another embodiment (being described further below), the insulation layer 18 may be partially covered by one or more further components, e.g., a laterally structured resist layer, and in this case, the insulation layer 18 with its contact hole 185 may serve as the mask basis.

As becomes apparent from the illustration in FIG. 1, the position (in terms of the first lateral direction X and the vertical direction Z) and the form of the insulation layer contact hole corner facing to the tilted implantation direction defines, together with a tilting angle, where the source region 101 is formed within the mesa region 105. For example, a higher insulation layer contact hole corner shifts the right boundary of the source region 101 to the left. A rounded corner would shift the right boundary of the source region 101 to the left, and so on.

A first implantation material used during the source implantation 21 for forming the semiconductor source region 101 may include one or more of the following materials: arsenic (As), antimony (Sb), selenium (Se), or phosphorus (P), or sulfur (S).

An implantation dose applied during the source implantation 21 for forming the semiconductor source region 101 may be within the range of 1E14 cm$^{-2}$ to 2E16 cm$^{-2}$.

An implantation energy applied during the source implantation 21 for forming the semiconductor source region 101 may be within the range of 10 keV to 300 keV.

As indicated above, the tilting angle applied during the source implantation 21 for forming the semiconductor source region 101 may be within the range of 10° to 60°, wherein the semiconductor wafer and/or the implantation device can be tilted so as to achieve said tilting angle.

Irrespective of how the source implantation 21 for forming the semiconductor source region 101 is carried out, it can be ensured that the formed semiconductor source region 101 extends for no more than 80% of the width of the mesa region 105 along the first lateral direction X. For example, to this end, the tilted source implantation 21 can be carried out such that the semiconductor source region 101 is arranged adjacent to only one of the two trench sidewalls 144 and spatially displaced along the first lateral direction X from the other one of the two trench sidewalls 154 of the trenches 14, 15 that laterally confine the mesa region 105.

As illustrated in FIG. 1, the semiconductor source region 101 can for example be implemented only at one side of the mesa region 105, e.g., within the section of the mesa region 105 that interfaces with the first trench 14 (e.g., a gate trench). For example, a distance between the right boundary of the semiconductor source region 101 and the other trench 15 that laterally confines the mesa region 105 amounts to at least 50 nm, to at least 200 nm or to at least 500 nm. For example, this distance can be the distance, along the first lateral direction X, between the trench sidewall 154 of the second trench 15 and a substantially vertically extending section of the pn-junction formed, adjacent to the semiconductor body surface 100, between the semiconductor source region 101 and the laterally adjacent section of the semiconductor body region 102 (it shall be understood that, of course, said pn-junction does not necessarily exhibit the strictly linear course as schematically illustrated in FIG. 1).

In an embodiment, the mesa region 105, as also illustrated in FIGS. 17A-B, has hence an asymmetrical design with respect to the illustrated vertical cross-sections (being in parallel to the plane defined by the first lateral direction X and the vertical direction Z), according to which the interface between the first load terminal 11 and the mesa region 105 is formed by both the semiconductor body region 102 and the semiconductor source region 101.

Whereas the electron current of the load current of the semiconductor device 1 is primarily conducted by sections of the mesa region 105 that laterally overlap with the semiconductor source regions 101, other types of currents, for example a hole current, may at least primarily be conducted by exclusively the body region 102 in the mesa region 105. Hence, it may be desirable that both the semiconductor source region 101 and the semiconductor body region 102 are properly electrically connected to the first load terminal 11; in other words: it may be desirable that the mesa region 105 is, with respect to the illustrated vertical cross-sections (being in parallel to the plane defined by the first lateral direction X and the vertical direction Z), well electrically connected to the first load terminal 11 by an interface formed by both the source region 101 and the body region 102, e.g., both a transition between the first load terminal 11 and the source region 101 as well as a transition between the first load terminal 11 and the body region 102 in said cross-section should be low ohmic to provide for a good electrical contact.

For example, as indicated above and illustrated in FIG. 1, formation the body region 102 may be continued after formation of the first insulation layer 18. For example, similar to the source implantation 21 for forming the source region 101, a body contact implantation 22 can be carried out using the at least one contact hole 185 at least partially as a mask basis for forming a semiconductor body contact region 1021 of the second conductivity type in the semiconductor body region 102, wherein the body contact implantation 22 may be tilted from the vertical direction Z, e.g., by an angle of at least 10° and against the tilting direction of the tilted source implantation 21. The body contact implantation 22 can be carried out before or after the tilted source implantation 21. Further, as will become apparent from the subsequent description, in another embodiment, formation of the body region 102 including the body contact region 1021 may be completed before forming the first insulation layer 18. For example, in such embodiment, the first insulation layer 18 servers as at least a mask basis only during application of the tilted source implantation 21.

Figure 2:
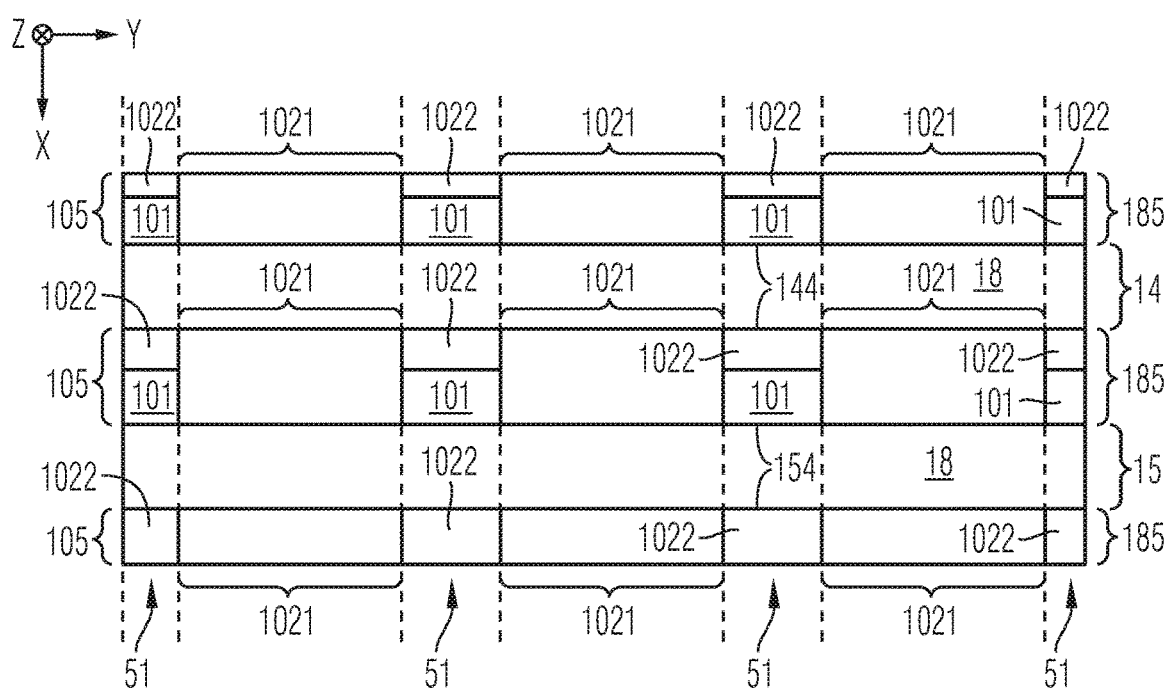
FIGS. 2-4 each schematically and exemplarily illustrate a section of a horizontal projection of a power semiconductor device at a stage of a semiconductor device processing method in accordance one or more embodiments.

Now referring to FIG. 2, which schematically and exemplarily illustrates a section of a horizontal projection the semiconductor device 1 at a stage of a semiconductor device processing method in accordance one or more embodiments, three contact holes 185 are shown adjacent to two subsections of the first insulation layer 18 being arranged above the first trench 14 (e.g., a gate trench) and the second trench 15 (e.g., a source trench), respectively.

Except for the body contact implantation 22 explained with respect to FIG. 1, the semiconductor device processing method of the embodiment shown in FIG. 2 may correspond to the embodiment shown in FIG. 1. Hence, after the body regions 102 have been formed in the mesa regions 105, e.g., by carrying out a blanket implantation, the first insulation layer 18 is formed and structured so as to produce the contact holes 185, and thereafter, the tilted source implantation 21 is carried out so as to produce the semiconductor source regions 101 in the mesa regions 105.

Thereafter, a masked body implantation can be carried out so as to form the body contact regions 1021 within the body regions 102, said body contact regions 1021 having an increased dopant concentration as compared to the remaining sections of the body regions 102. The masked body implantation can be masked as illustrated in FIG. 2, e.g., along the second lateral direction Y and based on covering stripes 51 (illustrated by the dotted lines along the vertical direction Z in FIG. 2) that extend along the first lateral direction X and that are equidistantly spaced apart from each other along the second lateral direction Y. Along these stripes 51, the semiconductor source regions 101 and the sections of the body regions 102 that have been previously formed are covered and are hence not subjected to the masked body implantation. The masked body implantation can be carried out so as to in particular overdope the source regions 101 that have been previously formed. Or, in another embodiment, the titled source implantation 21 is also a masked implantation, using, e.g., a mask complementary to the mask with stripes 51.

The sections of the body regions 102 that are covered by the stripes 51 during said masked body implantation hence do not exhibit the increased dopant concentration; these sections are labeled with reference numeral 1022.

To further influence the position of the semiconductor source regions 101, a resist layer may be formed above the first insulation layer 18 before carrying out the tilted source implantation 21, in accordance with some embodiments. This is exemplarily and schematically illustrated in FIGS. 5 and 6.

Generally speaking, according to one or more embodiment, a method of forming a power semiconductor device comprises providing a semiconductor body having a surface; forming a plurality of trenches, the trenches extending from the surface along a vertical direction into the semiconductor body, wherein two trench sidewalls facing to each other of two adjacent ones of the trenches laterally confine a mesa region of the semiconductor body along a first lateral direction; forming a semiconductor body region of a second conductivity type in the mesa region, wherein a surface of the semiconductor body region in the mesa region at least partially forms the semiconductor body surface; forming a first insulation layer on the semiconductor body surface, the first insulation layer having at least one contact hole exposing at least a part the mesa region surface. These steps can be carried out as exemplarily described above.

Thereafter, the method may include forming a resist layer 19, the resist layer comprising at least one opening and at least one resist block 191, the at least one opening partially exposing the mesa region surface 100-5, and the at least one resist block 191 partially covering the mesa region surface 100-5 (cf. FIG. 6), and subjecting the semiconductor body region 102 of the second conductivity type to a source implantation along the vertical direction Z using the at least one contact hole 185 and the at least one resist block 191 at least partially as a mask basis for forming the semiconductor source region 101 of the first conductivity type in the mesa region 105, wherein the formed semiconductor source region 101 extends for no more than 80% of the width of the mesa region along the first lateral direction X. Hence, since the resist block 191 may partially cover the mesa region surface 100-5, it is not necessary that the source implantation 21 is tilted, but the source implantation 21 can be carried out along the vertical direction Z and still, it can be achieved that the source region 101 extends for no more than 80% of the width of the mesa region along the first lateral direction X.

Figure 5:
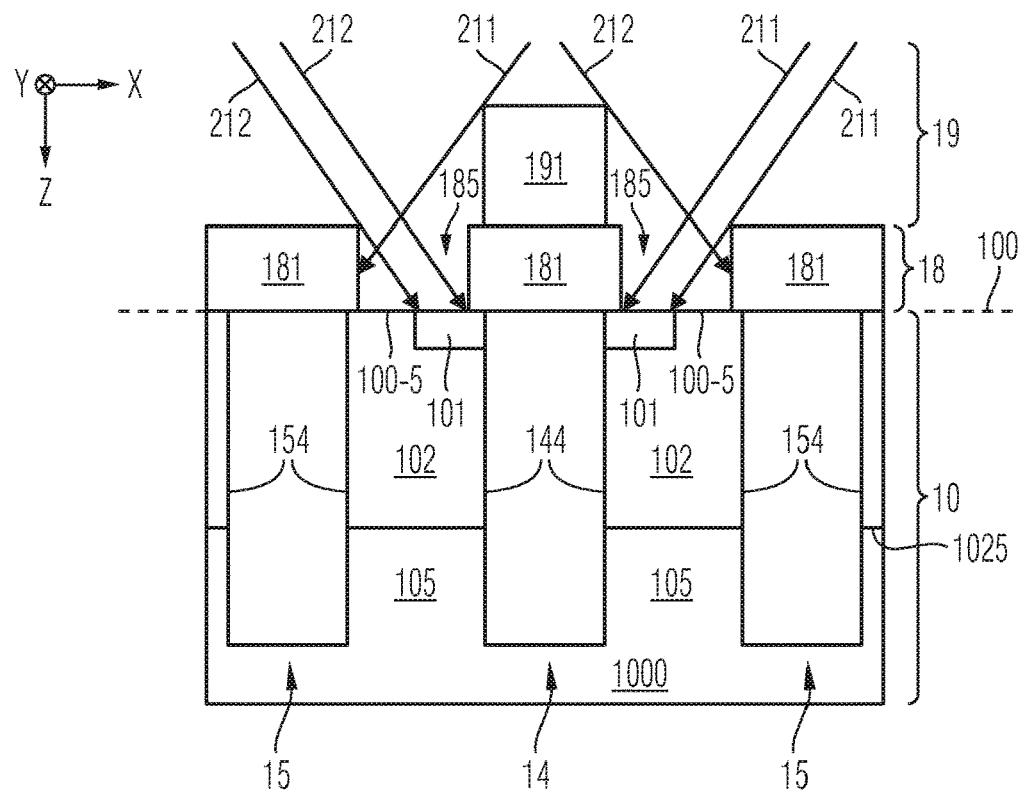
FIGS. 5-9 each schematically and exemplarily illustrate a section of a vertical cross-section of a power semiconductor device at a stage of a semiconductor device processing method in accordance one or more embodiments.

In another embodiment, the resist block 191 does not cover the mesa region surface 100-5, but is arranged exclusively above the first insulation layer 18, as exemplarily illustrated in FIG. 5.

In more general terms, the semiconductor device processing method may hence include, after forming the first insulation layer 18 and before carrying out the source implantation 21, forming the resist layer 19, wherein the resist layer 19 may be laterally structured.

Figure 7:
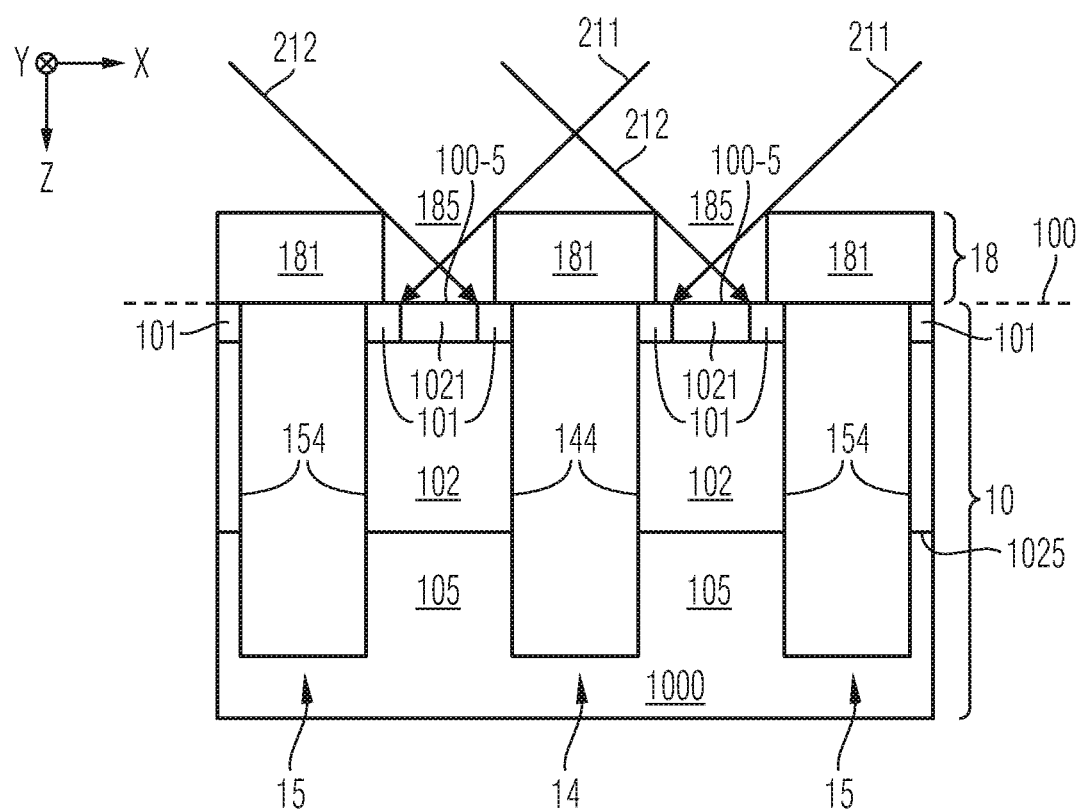

For example, referring to both FIG. 5 and FIG. 7, the titled source implantation 21 may comprise a first titled source implantation step 211 and a second titled source implantation step 212, the implantations 211, 212 being tilted from the vertical direction Z by a respective angle of at least 10° and against opposing tilting directions so as to form semiconductor source regions 101 adjacent to both trench sidewalls 144 of one of the two trenches 14, e.g., adjacent to both trench sidewalls 144 of the first trench 14 (e.g., the gate trench).

For example, in order to a) ensure that the semiconductor source regions 101 are formed adjacent to both trench sidewalls 144 of the first trench 14, and b) that the both of the formed semiconductor source regions 101 extend for no more than 80% of the width of the respective mesa region 105 along the first lateral direction X, several options exist.

In accordance with one option, as illustrated in FIG. 7, the tilting angles are increased, e.g., up to more than 30° or even more than 45° with respect to the vertical direction Z. For example, the first and second source implantations 211, 212 are carried out so as to not subject a central subportion of the second conductivity type of the mesa region 105 to the two implantation steps 211, 212, the central subportion in the mesa region 105 being laterally displaced from the semiconductor source region (101) of the mesa region 105 and forming a part of the mesa region surface 100-5. Rather, the above described body contact region 1021 may be formed in this central subportion of the mesa region 105.

Another option is illustrated in FIG. 5, where the resist block 191 ensures, at comparatively small tilting angles, that the source regions 101 do not extend too far in or against the first lateral direction X.

Figure 6:
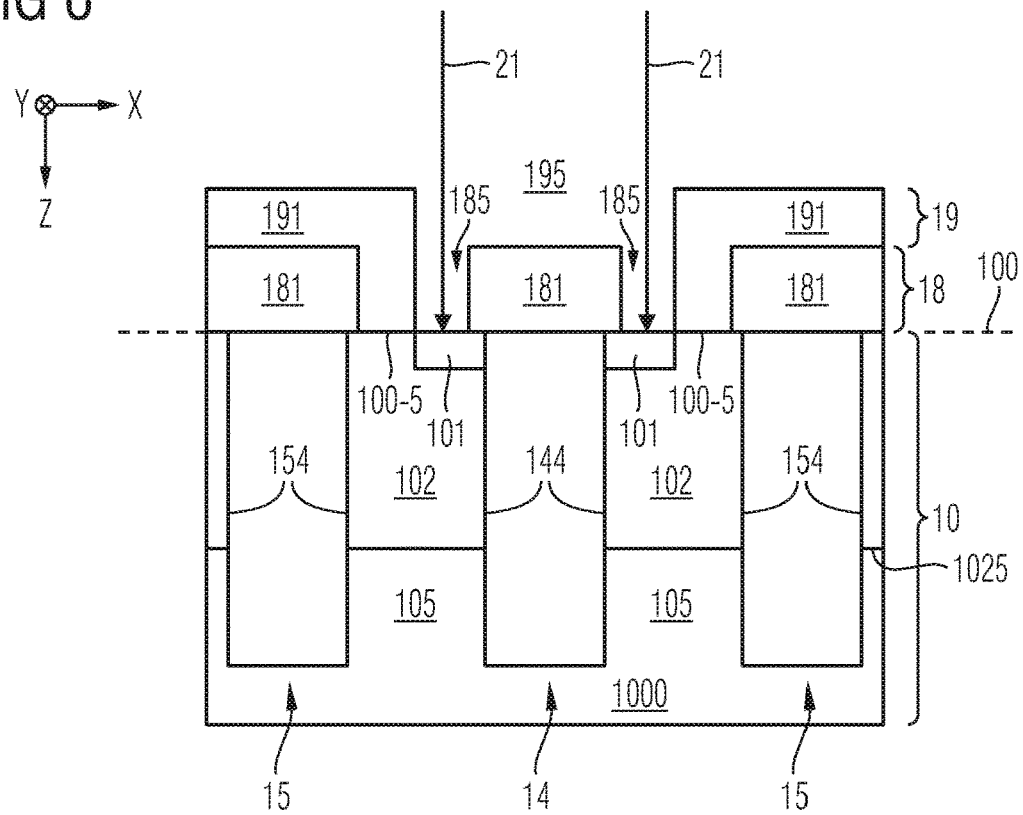

In accordance with yet another option, the source implantation 21 is not tilted at all, but the resist blocks 191, cover the mesa region surfaces 100-5 at least partially, as illustrated in FIG. 6.

Figure 3:
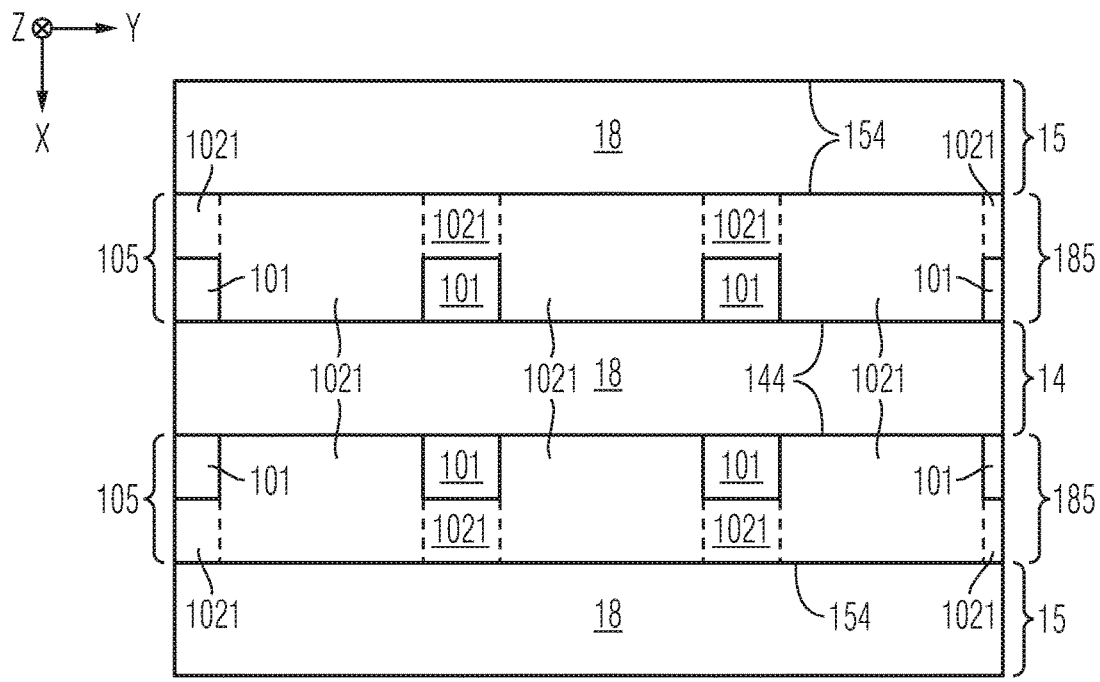
Figure 4:
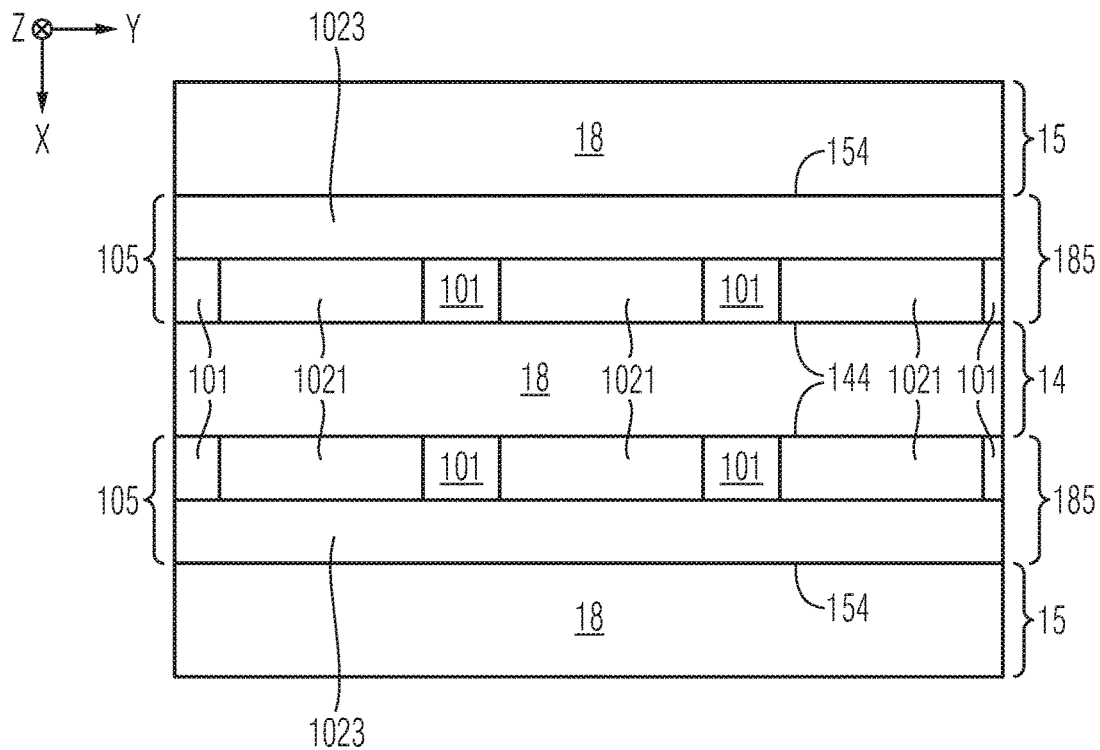

Further optional aspects of forming the semiconductor source region 101 by subjecting the semiconductor body region 100 to the tilted source implantation 21 using the contact hole 185 at least as a mask basis will be described further below. The now following explanation, which also refers to FIGS. 2-4, is directed to optional aspects of forming the semiconductor body region 102 and its body contact region 1021 that it may include.

As explained above, forming the semiconductor body region 102 may include one or more body implantations.

Additionally, in still general terms, each of the one or more body implantations can occur along the vertical direction Z (i.e., non-titled), or, one or more of the one or more body implantations can be tilted. Further, each of the one or more body implantations can occur unmasked with respect to the mesa regions 105, or, one or more of the one or more body implantations can be masked with respect to the mesa regions 105.

In an embodiment, each of the one or more body implantations is carried out before forming the first insulation layer 18. Hence, forming the semiconductor body region 102 by means of the one or more body implantations can be completed before forming the first insulation layer 18, i.e., before forming the semiconductor source region 101.

In another embodiment, forming the semiconductor body region 102 includes more than one body implantation, wherein a first body implantation is carried out before forming the first insulation layer 18 (and, hence, before forming the semiconductor source region 101) and one or more subsequent second or third body implantations are carried out after forming the first insulation layer 18 (before and/or after the semiconductor source region 101 has been formed by means of the tilted source implantation 21).

For example, the body implantation comprises a first body implantation and a masked second body implantation, the masked second body implantation being carried out with a higher implantation dose as compared to the first body implantation. Both body implantations can be carried out along the vertical direction Z. For example, the first body implantation is carried out so as to form the body region 102 within the entire mesa regions 105. The masked second body implantation can be carried out so as to form, locally, the body contact regions 1021. For example, the first body implantation is carried out before forming the first insulation layer 18. The second masked body implantation can be carried out after forming the first insulation layer 18 and, for example, also after forming the semiconductor source regions 101. As indicated above, the tilted source implantation 21 is carried out such that body region 102 formed by means of the body implantation(s) is overdoped in sections where the semiconductor source regions 101 are to be formed. For example, by means of the mask employed during the second masked body implantation, the formed semiconductor regions 101 are locally covered, as exemplarily illustrated in FIGS. 3 and 4. The second masked body implantation can then be carried out so as to overdope the semiconductor source regions 101 that are not covered by the mask, as illustrated in FIG. 3; or, in another embodiment, such overdoping may be obsolete if the titled source implantation 21 is also a correspondingly masked implantation. In other words, the tilted source implantation does not overdope those regions which are subjected to the masked second body implantation, in accordance with an embodiment.

To ensure a good electrical contact between the semiconductor source region 101 and the first load terminal 11, the at least one contact hole 185 exposes a section of the mesa region surface 100-5 that was covered by the mask during the masked second body implantation. This is also schematically and exemplarily illustrated in FIGS. 3 and 4, where the contact holes 185 of the first insulation layer 18 expose each of the semiconductor source regions 101 as well as the body contact regions 1021, e.g., the entire surfaces 100-5 of the mesa regions 105.

As indicated above, it is possible that both the first body implantation and the masked second body implantation are carried out in parallel to the vertical direction Z, i.e., non-titled.

Both the first body implantation and the masked second body implantation can occur unmasked along the entire width of the (designated) contact hole 185 (depending on whether or not the first insulation layer 18 has been formed) along the first lateral direction X or, respectively, unmasked along the entire width of the mesa region 105 along the first lateral direction X. The masked second body implantation can be masked along a length of the (designated) contact hole 185 in the second lateral direction Y, or, respectively, masked along the length of the mesa region 105 in the second lateral direction Y e.g., by means for said stripes 51 illustrated in FIG. 2.

In addition to being masked along the second lateral direction Y, the masked second body implantation can also be masked, with respect to the width of the mesa region 105, along the first lateral direction X, as exemplarily and schematically illustrated in FIG. 3. For example, the mask employed during the second masked body implantation may cover entirely about 50% of the width of the mesa region 105 adjacent to the second trench 15 that laterally overlaps with the source regions 101 along the second lateral direction, wherein said cover is indicated by the dotted lines in FIG. 3.

Additionally in accordance with the embodiments described with respect to FIG. 2 and FIG. 3, the body implantation may comprise a third body implantation for increasing the dopant concentration of the semiconductor body region 102 in a section 1023 of the mesa region 105 that is laterally displaced from the (to be formed or already formed) source region(s) 101 along the first lateral direction X. For example, this section 1023 laterally overlaps with a stripe section of the mesa region 105 arranged laterally adjacent to the second trench 15, as illustrated in FIG. 3.

As explained above, whereas the optional second and the optional third body implantations can be masked implantations, the first body implantation can be an unmasked implantation (also known as "blanket" implantation), at least with regards to the active area of the device 1 which includes the plurality of the power cells and which may be surrounded by an edge termination area, as it is known to the skilled person.

Further, as also explained above, at least one or all implantations carried out for forming the body region 102 (including its optional body contact regions 1021 and its optional highly doped sections 1023) can be completed before the first insulation layer 18 is formed. For example, after formation of the first insulation layer 18, no further implantation is carried out to form or, respectively, modify the body region 102, in accordance with an embodiment.

After the source regions 101 and the body regions 102 have been completely formed, including optional temperature annealing processing steps, the semiconductor device processing method may further include forming the first load terminal 11 by depositing an electrically conductive material within the contact holes 185, e.g., so as to electrically contact each of the power cells of the power semiconductor device 1. Specifically, by means of the contact hole 185 filled with the electrically conductive material, both the source region 101 and the body region 102 (including its body contact region 1021) may be electrically contacted and the electrical contact between the mesa region 105 and the first load terminal 11 is established.

Further as has been explained above, the two adjacent trenches 14 and 15 (of each power cell) can be formed as the control (gate) trench 14 having the control (gate) electrode 141 configured for inducing the inversion channel in the body region 102 to control the load current in the mesa region 105, and as the source trench 15 having the source electrode 151, e.g., electrically connected or at least coupled to the first load terminal 11.

In addition, as has already been indicated with respect to FIG. 17B, the power semiconductor device processing method may further include, after forming the first insulation layer 18 and before or after carrying out the source implantation 21, forming the groove contact 111 extending into the mesa region 105 along the vertical direction Z. For example, the semiconductor source region 101 is formed only adjacent to one side (with respect to the first lateral direction X) of the groove contact 111, e.g., between the first trench 14 and the groove contact 111, but not between the groove contact 111 and the second trench 15.

Referring to all embodiments described herein, the power semiconductor device processing method may further include subjecting the first insulation layer 18 to a reflow processing step. For example, the reflow processing step is carried out after the source implantation 21 has been completed. For example, the geometrical structure of the first insulation layer 18 is more definite before the reflow processing step, and, hence, the semiconductor source region 101 can be more accurately positioned by means of the (titled) source implantation 21. In other embodiments, the first insulation layer 18 may be specifically modified with respect to the desired position of the semiconductor source region 101.

With respect to FIGS. 8 to 15, aspects of further exemplary embodiments shall be described, wherein these optional aspects relate to use of the laterally structured resist layer 19 during the source implantation 21 and to different types of contacting schemes which may be employed for forming the power cells of the power semiconductor device 1. The subsequent explanation is not directed to the formation of the body region 102, wherein it shall be understood that the body region 102 can be formed, also in accordance with the embodiments illustrated in FIGS. 8 to 15, as explained above.

Figure 8:
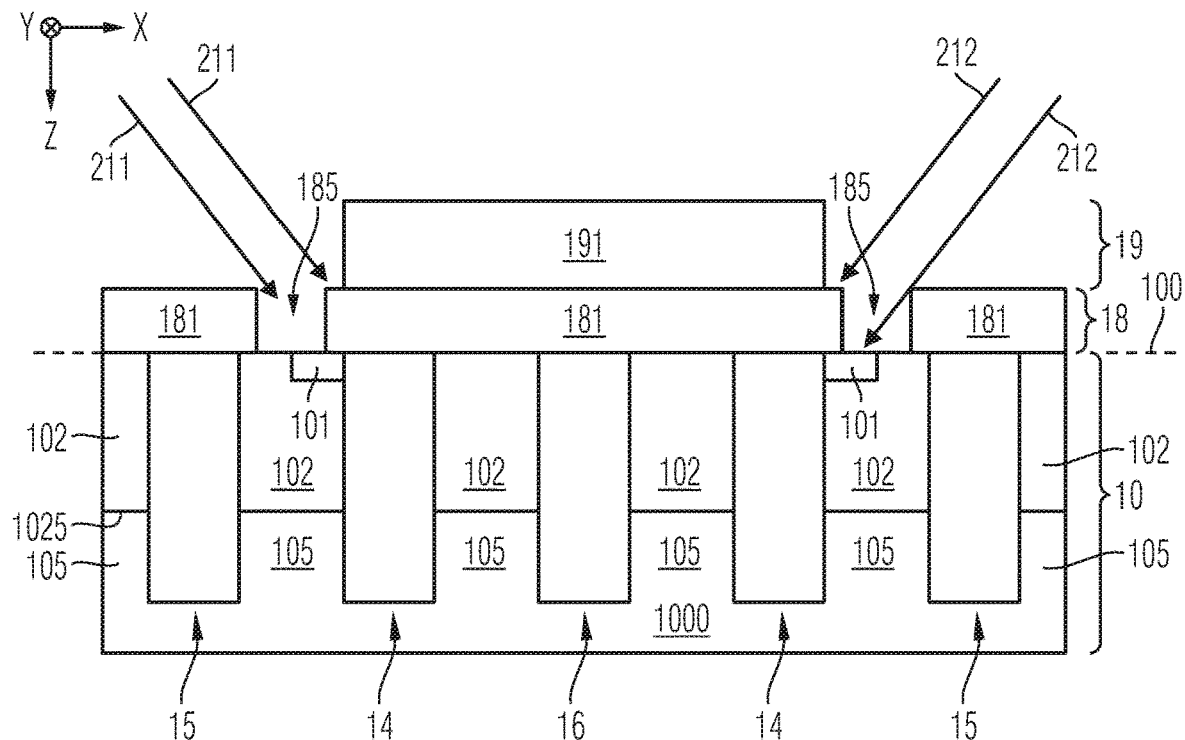

For example, referring to FIG. 8, each power cell may comprise two second trenches 15, and between these two second trenches 15, two first trenches 14, and between the two first trenches 14, a third trench 16. The third trench 16 can be, for example, the above-mentioned dummy trench, i.e., comprise a trench electrode (not illustrated) that is electrically connected to the trench electrodes 141 of the first trenches 14, wherein the third trench 16 is not capable of controlling a load current due to absence of any source regions in its adjacent mesa regions 105. The first insulation layer 18 may be formed and structured so as to exhibit the contact holes 185 exposing only those mesa regions 105 that are laterally confined by one of the first trenches 14 and one of the second trenches 15. The first insulation layer 18 can be structured such that insulation blocks 181 cover the three central trenches 14 and 16 as well as the two mesa regions 105 laterally confined by these three trenches, and the two outer second trenches 15. In these mesa regions 105, the semiconductor source regions 101 are formed, e.g., by carrying out the first source implantation 211 and the second source implantation 212 that are tilted in opposing tilting directions, as illustrated. Before the first source implantation 211 and the second source implantation 212, the resist block 191 is formed above the insulation block 181 so as to ensure that during the tilted first implantation 211 and the tilted second implantation 212, the corresponding semiconductor source regions 101 are spatially displaced from the respective second trench 15. By means of choosing a height and/or a width (in the first lateral direction X) of the resist block 191, the geometrical dimensions of the source regions 101 may be influenced. For example, a resist "pull-back", with respect to the underneath insulation block 181, as indicated in FIG. 8, may lead to a lateral extension of the source regions 101. At given tilting angles, it is clear to the skilled person how a modification of the dimension of the resist block 191 may influence the position of the source regions 101.

Figure 10:
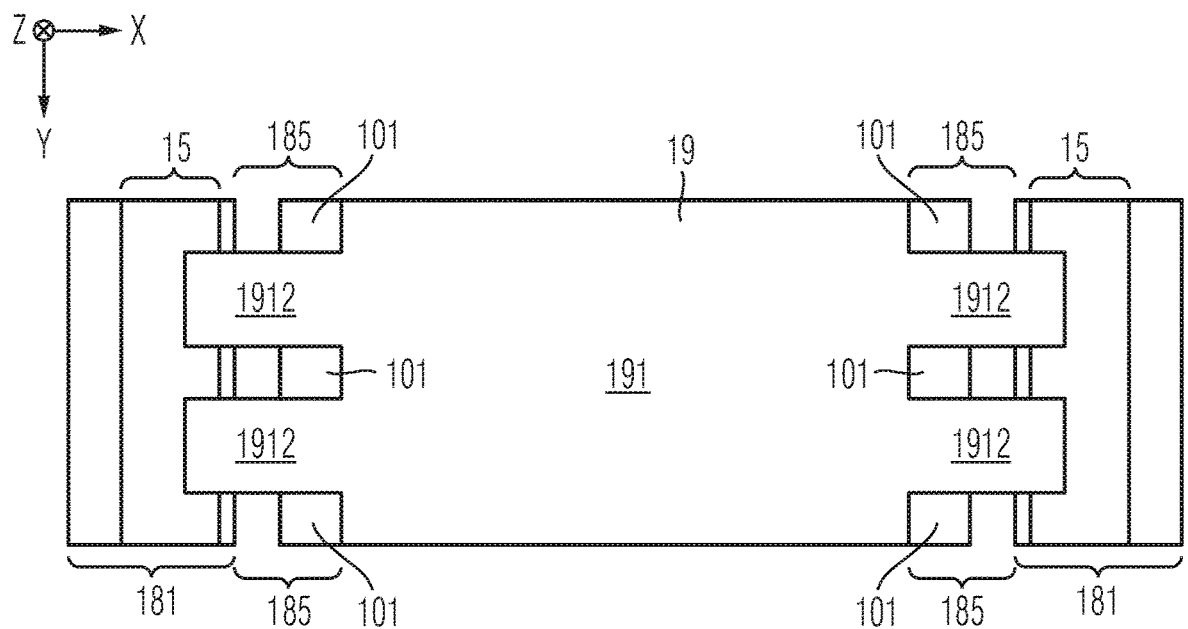
FIGS. 10-11 each schematically and exemplarily illustrate a section of a horizontal projection of a power semiconductor device at a stage of a semiconductor device processing method in accordance one or more embodiments.

FIG. 10 exemplarily and schematically illustrates a section of a horizontal projection of the embodiment shown in FIG. 8. Hence, the resist layer 19 may be laterally structured such that the resist block 191 is provided with optional resist block fingers 1912 that extend beyond the entire mesa regions 105 in which the semiconductor source regions 101 are to be formed and even cover the insulation blocks 181 that are arranged above the second trenches 15. The resist block fingers 1912 may allow for the lateral structure of the semiconductor source region 101 along the second lateral direction Y.

Figure 9:
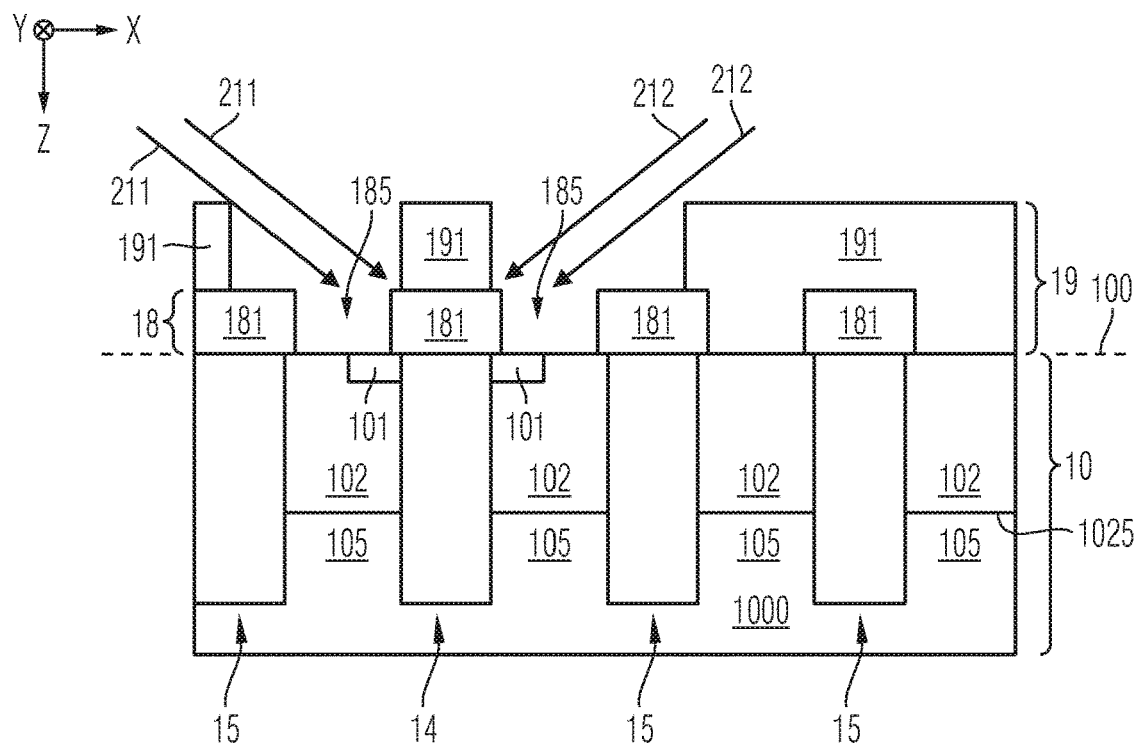
Figure 11:
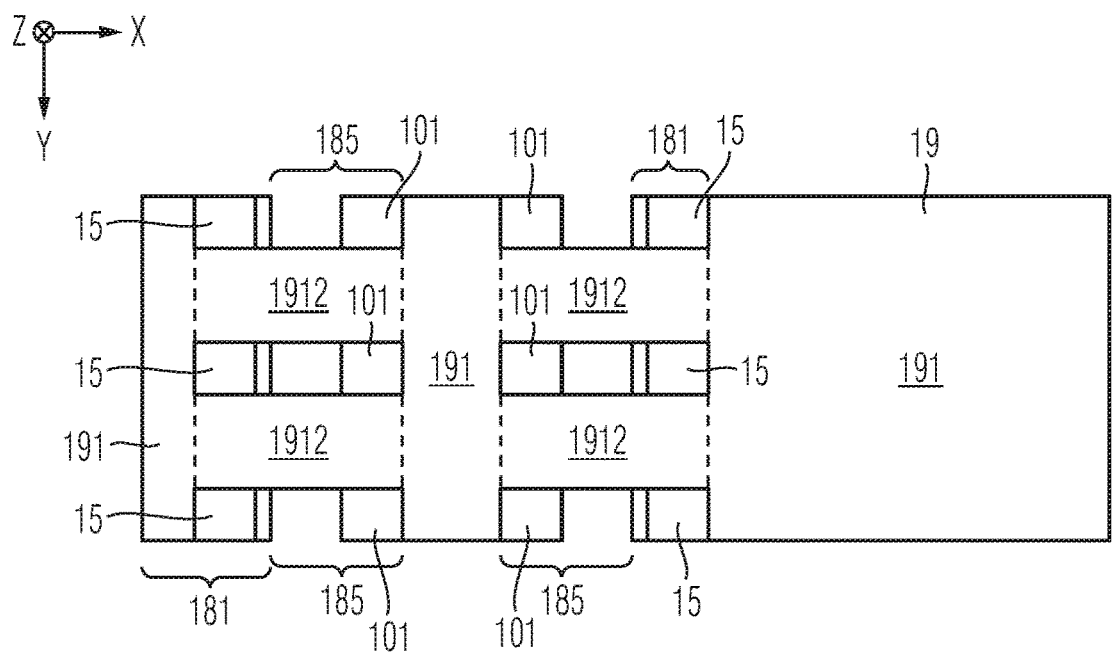

With reference to FIGS. 9 and 11, another contacting scheme is presented. For example, each power cell comprises three second trenches 15 and one first trench 14 and is configured in such a way that the first trenches 14 are neighbored by two second trenches 15, the third second trench 15 being arranged adjacent to one of the neighboring two second trenches 15. Both mesa regions 105 arranged adjacent to the first trench 14 are equipped with a respective source region 101. In order to form the source regions 101, it may generally be proceeded as described above, hence, by forming the first insulation layer 18 including the insulation blocks 181 defining the contact holes 185, and by forming the laterally structured resist layer 19 with the plurality of resist blocks 191. Those mesa regions 105 which shall not be electrically connected to the first load terminal 11 (not illustrated in FIG. 9) may be entirely covered by one of the resist blocks 191, as schematically and exemplarily illustrated in FIG. 9. Also in accordance with the embodiment illustrated by FIGS. 9 and 11, the source regions 101 may be formed by carrying out the first tilted source implantation 211 and the second tilted source implantation 212. By means of the height of the relevant resist blocks 191 and by means of their lateral extensions (along the first lateral direction X), the positions of the semiconductor source regions 101 may be defined. Of course, regarding the position of the source regions 101 at given tilting angles, also the height of the first insulation layer 18 is relevant, as has been explained above.

FIG. 11 schematically and exemplarily shows a section of a horizontal projection of the embodiment shown in FIG. 9, illustrating in particular the lateral structure of the resist layer 19 and its resist block(s) 191. In FIG. 11, those parts of the resist block 191 which are visible also in FIG. 9 are labelled with the reference numeral 191. Similar to the embodiment illustrated in FIGS. 8 and 10, by means of the optional resist fingers 1912, the source regions 101 may be laterally structured along the second lateral direction Y.

Hence, the lateral structure of the resist layer 19 does not only influence the position of the source region 101 in terms of the first lateral direction X, but may also be used in order to structure the source regions 101 along the second lateral direction Y, in accordance with some embodiments.

Figure 12:
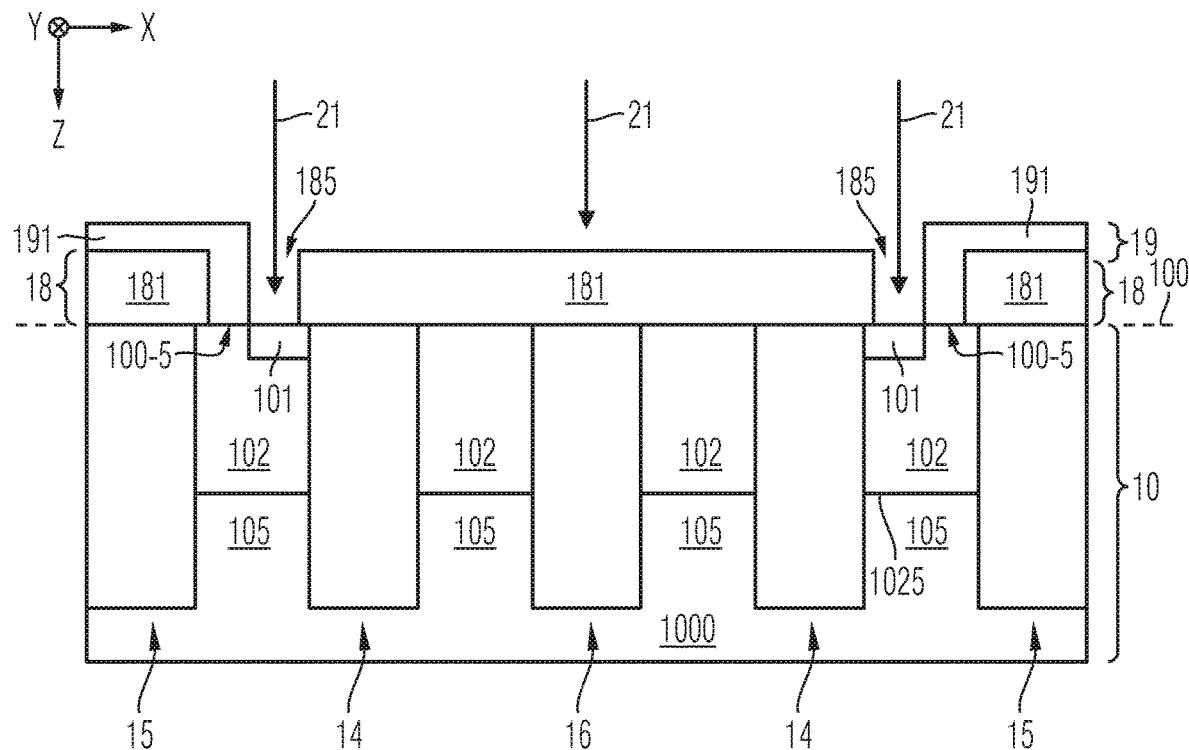
FIG. 12-13 each schematically and exemplarily illustrate a section of a vertical cross-section of a power semiconductor device at a stage of a semiconductor device processing method in accordance one or more embodiments.
Figure 13:
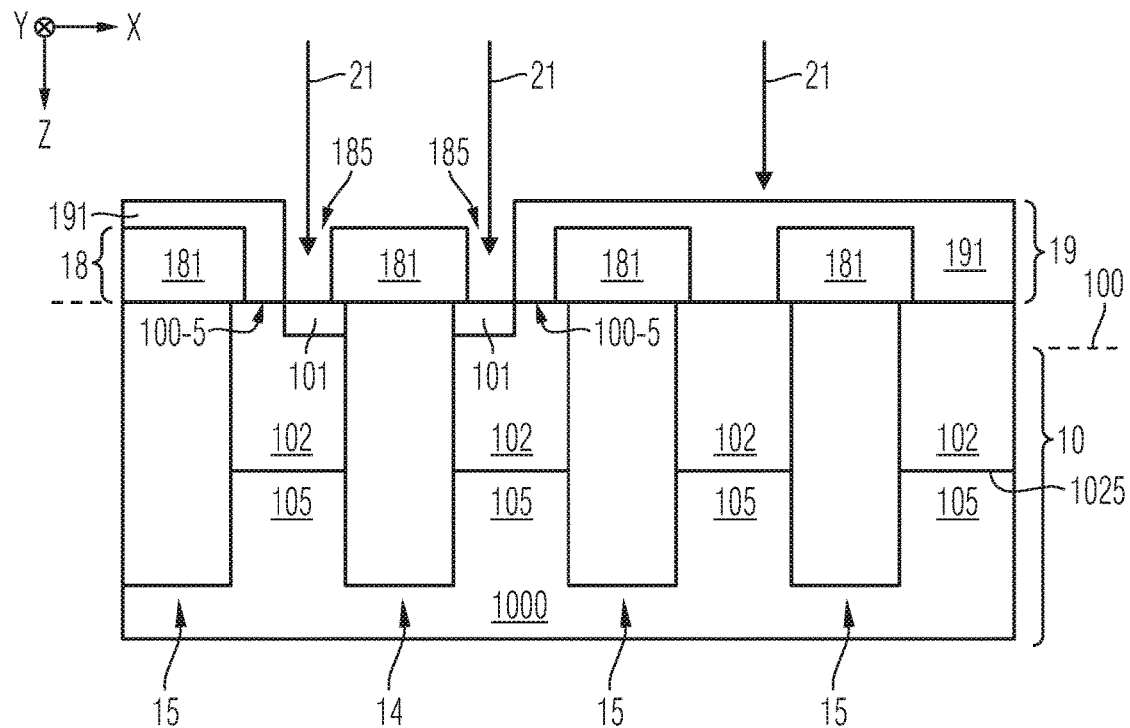
Figure 14:
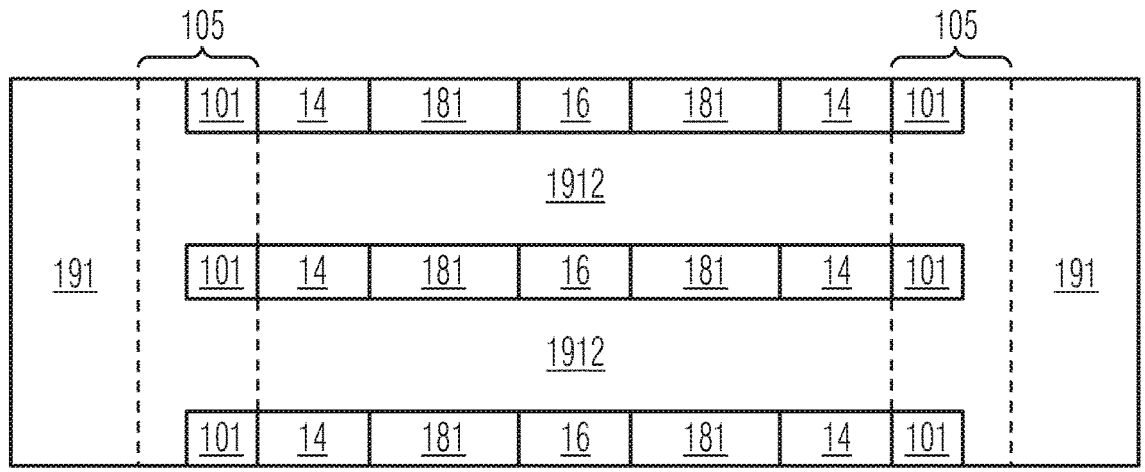
FIGS. 14-15 each schematically and exemplarily illustrate a section of a horizontal projection of a power semiconductor device at a stage of a semiconductor device processing method in accordance one or more embodiments.
Figure 15:
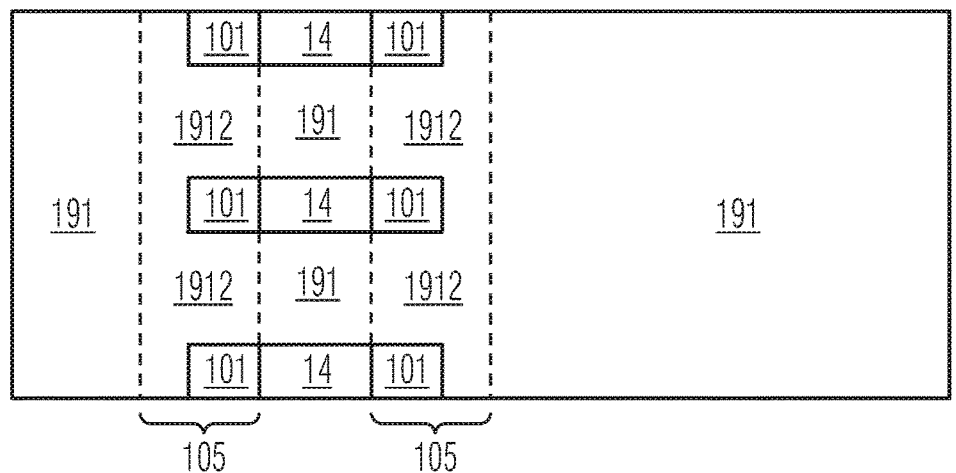

FIGS. 12 and 14 illustrate a slight modification to the embodiment shown in FIGS. 8 and 10, and FIGS. 13 and 15 illustrate a slight modification to the embodiment shown in FIGS. 9 and 11. As explained above, producing the source regions 101 with limited lateral extension (e.g., no more than 80% of the width of the mesa region 105 along the first lateral direction X) does not necessarily involve carrying out a tilted source implantation, but the source implantation 21 can occur along the vertical direction Z, if, for example, the resist blocks 191 partially cover the mesa region surface 100-5. Hence, as has already been explained with respect to FIG. 6, the sections of the mesa regions 105 covered by the resist blocks 191 are not subjected to the source implantation 21, and hence, the semiconductor source regions 101 will substantially not extend into these mesa sections. The remaining description of FIGS. 8 to 11 may analogously apply to the embodiments of FIGS. 12 and 14 as well as FIGS. 13 and 15, respectively.

Figure 16:
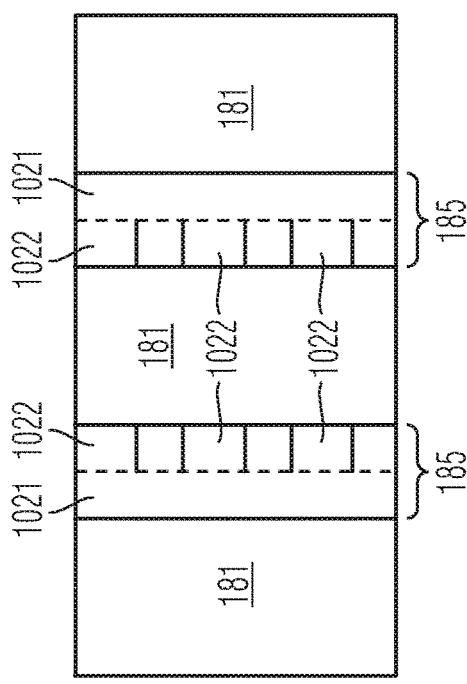
FIG. 16 schematically and exemplarily illustrates stages of a semiconductor device processing method in accordance with one or more embodiments.
Figure 16:
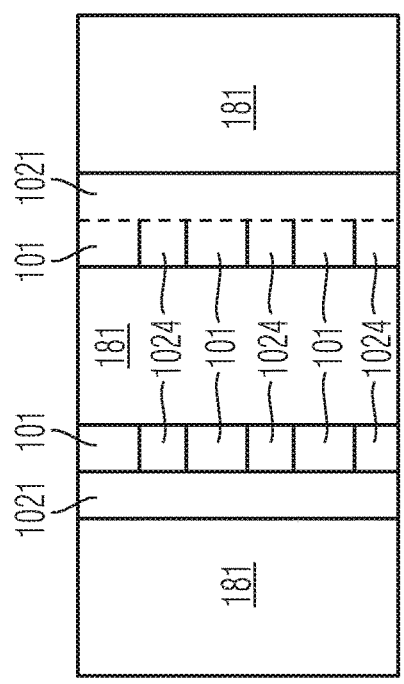
Figure 16:
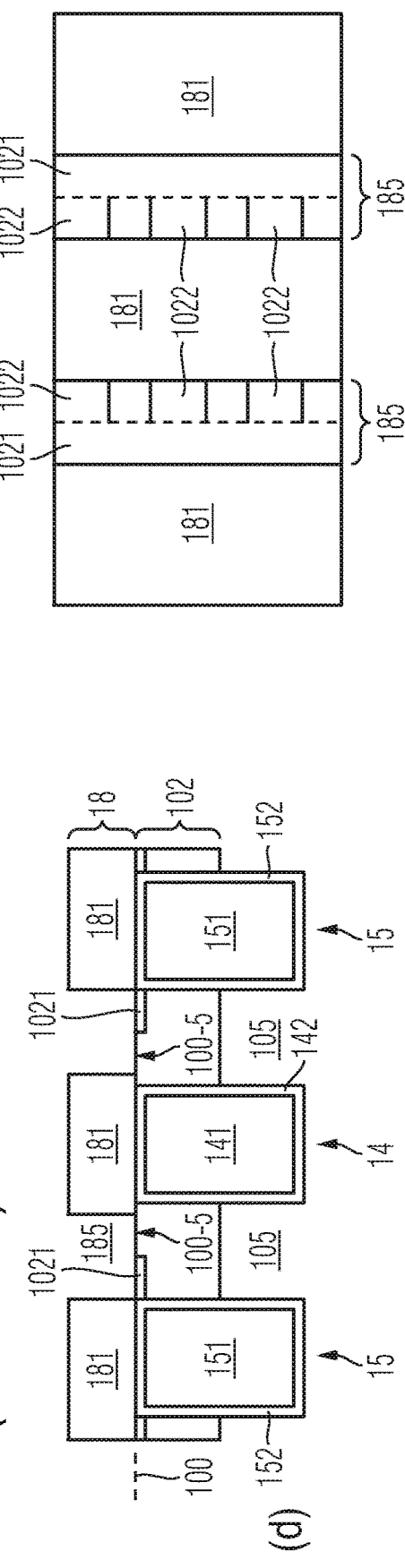
Figure 16:
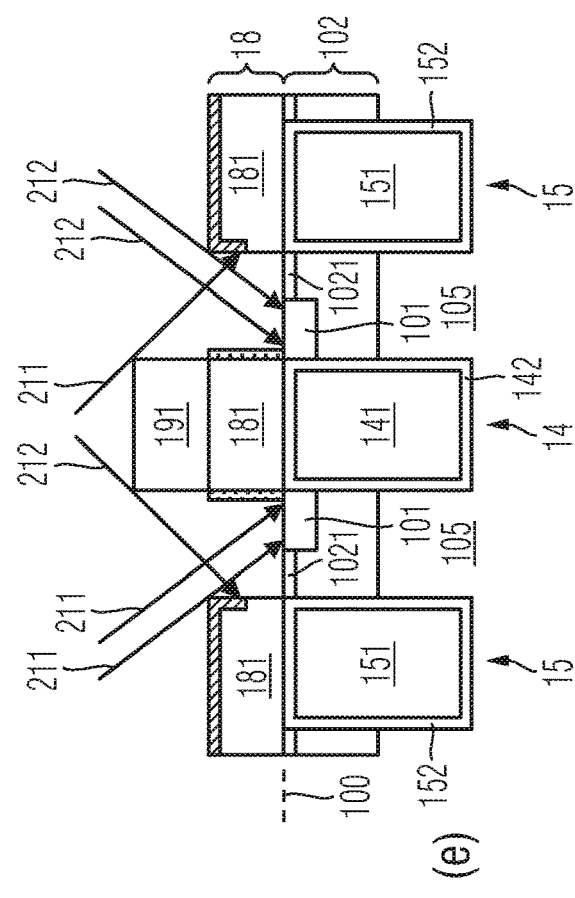

The following, it will be referred to FIG. 16 (which extends over drawing sheets 9 and 10) for explaining an exemplary process flow of an embodiment of the power semiconductor device processing method. In the left part of FIG. 16, a respective section of a vertical cross-section of the semiconductor device during a specific processing stage is illustrated, and the right part of FIG. 16 shows a section of a horizontal projection.

At processing stage (a), the semiconductor body 10 has been provided, the trenches 14 and 15 have been formed, including the trench electrodes 141, 151 and the trench insulators 142, 152, and the semiconductor body region 102 has been formed, e.g., by carrying out a blanket implantation, e.g. The above-mentioned first body implantation. Further, a first temperature annealing processing step has been carried out so as to cause healing and diffusion of the implanted material used for forming the body region 102.

Processing stages (b) and (c) are directed to further forming the body region 102, while taking into account the designated position of the source regions 101 to be formed.

For example, at stage (b), a laterally structured resist layer 30 is deposited on the semiconductor body surface 100, e.g., so as to partially cover the first trench 14 as well as the surfaces 100-5 of its adjacent mesa regions 105. The resist layer 30 can be structured along the second lateral direction Y, e.g., by laterally displaced stripe sections 301, as schematically illustrated in the right part of stage (b). Then, the above-mentioned masked second body implantation can be carried out, using the laterally structured resist layer 30 as a mask (illustrated only in the left part of stage (b), not in the right part of stage (b)). This implantation may lead to preliminary body contact regions 1021-1. The preliminary body contact regions 1021-1 come hence into being in sections of the mesa regions 105 which are not covered by the resist layer 30. Further, it is understandable already at this point, that the laterally structured resist layer 30 used as a mask during the second body implantation covers those sections of the mesa regions 105 where the semiconductor source regions 101 are to be produced.

For example, at stage (c), which is optional, a further masked body implantation may be carried out. This further masked body implantation may be carried out using the same laterally structured resist layer 30 as during stage (b), as illustrated in the left part of stage (c), or using a different laterally structured mask 31, as illustrated in the right part of stage (c). When using the laterally structured mask 31 different from the laterally structured mask 30, it can be ensured that those sections of the mesa regions 105 covered by the laterally structured mask 30 are also covered by the other laterally structured mask 31, as illustrated in the right part of stage (c).

In any case, the result of processing stages (a) and (b) and the optional processing stage (c) includes the body region 102 and the body contact regions 1021.

The next processing stages (d) and (e) are directed to forming the semiconductor source regions 101:

For example, within the scope of stage (d), the resist layer(s) used for forming the body region 102 are removed. After the removal of the resist layer(s), the first insulation layer 18 may be formed, which may include an oxide deposition processing step and subsequent etch processing step, yielding the insulation blocks 181 which define the contact holes 185. Regarding the right part of stage (d), it becomes apparent that the mesa region surfaces 100-5 are entirely formed by the body region 102, wherein, depending on the previously used resist layers, the dopant concentration may laterally vary along the mesa region surfaces 100-5. For example, reference numeral 1021 illustrates the highly doped body contact region. Reference numeral 1022 indicates those sections of the body region 102 that were covered by the resist layer 30, specifically: the stripe sections 301, used during the processing stage (b). The parts of the body region 102 which are not labeled with a reference numeral in the right part of processing stage (d) either have the same dopant concentration as the regions 1022, namely if the resist layer 30 is not changed at processing stage (c). However, if the other resist layer 31 is used during processing stage (c) (as illustrated in the right part of stage (c)), then the non-labeled sections of the body region 102 would not become subjected to the third body implantation, and would hence exhibit a dopant concentration higher than the dopant concentration of regions 1022, but lower than the dopant concentration of region 1021.

Hence, the contact holes 185, which may extend stripe like according to the mesa regions 105, may expose the mesa region surfaces 100-5 that are formed by sections of the body region 102 having different dopant concentrations.

At processing stage (e), the mesa region surfaces 100-5 are subjected to the tilted source implantation so as to form the semiconductor source regions 101. As explained above, the source implantation may include the first tilted source implantation 211 and, optionally, the second tilted source implantation 212 so as to form the semiconductor source regions 101 adjacent to only one side of the first trench 14 or, as illustrated, so as to form the semiconductor source regions 101 adjacent to both sides of the first trench 14. Whether or not the second tilted source implantation 212 is carried out may depend on the desired final design of the power cells of the power semiconductor design, e.g., on the desired contacting scheme. Forming the source region(s) 101 may or may not include forming, before carrying out the source implantation, the resist layer 19 including the resist block 191, as explained above. Whether or not the resist layer 19 is necessary may depend on the total height of the first insulation layer 18 and/or the chosen tilting angles.

Due to the tilted source implantations 211 and 212, the stripe like body contact regions 1021 are substantially not subjected to the implantations, but rather only the sections of the body region 102 indicated with reference numeral 1022 and the adjacent non-labeled sections (as illustrated in the right part of stage (d)). The tilted source implantations 211 and 212 overdope at least sections 1022, such that at least there the semiconductor source regions 101 of the first conductivity type come into being. For example, the tilted source implantations 211 and 212 are carried out so as to not overdope the non-labelled sections, leading to weekly doped sections 1024 of the second conductivity type. Hence, it shall be understood that even though the first insulation layer 18 may not be structured along the second lateral direction Y, by choosing corresponding resist layers during formation of the body region 102 and by choosing corresponding implantation energies/doses during formation of the body region 102 and the source region 101, the source region 101 may be laterally structured along the second lateral direction Y.

After the source region 101 has been formed, the resist layer 19 (if used at all) may be removed. Other processing steps, which are not illustrated, may include one or more thermal processing steps to get the implantation material used for the source region 101 and/or the implantation material used for the channel region 102 electrically activated.

Of course, the herein proposed method may include further processing steps so as to complete manufacturing of the power semiconductor device 1, which may, as explained above, finally exhibit a MOSFET configuration or an IGBT configuration or an RC-IGBT configuration or a configuration derived from one of these basic power semiconductor device configurations, such as an RC-IGBT with diode control (RCDC) configuration. For example, such further processing steps may be carried out so as to form the first and second load terminals 11 and 12, e.g., by deposition of metallizations. The further processing steps may further include forming the first doped region, e.g., by means of implantation.

An optional effect that may come into being due to forming the semiconductor source regions 101 by means of the two tilted source implantations 211 and 212 is indicated by the crosshatched and dotted regions at the insulation blocks 181. As it is apparent from the foregoing description, vertical flanks of the insulation block 181 that covers the first trench 14 are substantially entirely subjected to the two implantations 211 and 212 (dotted area). In contrast, the vertical flanks of the two insulation blocks 181 that cover the second trenches 15 are only partially subjected to the two tilted implantations 211 and 212 (crosshatched area). Thus, each of the three insulation blocks 181 may exhibit a concentration of the implantation material used for forming the semiconductor source regions 101, wherein the concentration profile of the implantation material may differ between the insulation blocks 181.

Hence, in accordance with an embodiment and now referring to FIGS. 17A-B again, presented herein is also a power semiconductor device 1 having the following features:

- a semiconductor body 10, the semiconductor body 10 being coupled to a first load terminal 11 and a second load terminal 12 and configured to conduct a load current between said terminals 11, 12;
- a first trench 14 and a second trench 15 that extend from a surface 100 of the semiconductor body 10 along a vertical direction Z, wherein the trenches 14, 15 laterally confine a mesa region 105 along the first lateral direction X;
- a semiconductor source region 101 of the first conductivity type and a semiconductor body region 102 of the second conductivity type, both regions 101, 102 being arranged in the mesa region 105 adjacent to a trench sidewall 144 of the first trench 14 and electrically connected to the first load terminal 11, wherein the semiconductor source region 101 is based on a first implantation material, and wherein the first trench 14 is configured for inducing an inversion channel in the body region 102 to control a load current in the mesa region 105;
- a first insulation layer 18 arranged above the semiconductor body surface 100 and having a plurality of insulation blocks 181, two of which laterally confining a contact hole 185 of the first insulation layer 18, wherein the first load terminal 11 extends into the contact hole 185 to contact both the semiconductor source region 101 and the semiconductor body region

102 at a surface 100-5 of the mesa region 105, wherein a first of the two insulation blocks 181-1 laterally overlaps with the first trench 14 and a second of the two insulation blocks 181-2 laterally overlaps with the second trench 15, the first insulation block 181-1 having a first lateral concentration profile of the first implantation material along the first lateral direction X that is different from a second lateral concentration profile of the first implantation material along the first lateral direction X present in the second insulation block 181-2.

For example, based on the explanation of the left part of stage (e) of FIG. 16, the first insulation block 181-1 (i.e., the insulation block that covers the first trench 14 in FIG. 17A/B) has a first concentration of the first implantation material that is greater than a second concentration of the first implantation material present in the second insulation block 181-2 (i.e., the insulation block that covers one of the second trenches 15 in FIG. 17A/B), the first concentration being present in a section of the first insulation block 181-1 that laterally overlaps with the trench sidewall 144 of the first trench 14 (cf. dotted areas of insulation block 181-1), and the second concentration being present in a section of the second insulation block 181-2 that laterally overlaps with a trench sidewall 154 of the second trench 15 (cf. cross-hatched areas in the second insulation blocks 181-2), said trench sidewall 154 laterally confining the mesa region 105.

For example, said first concentration of the first implantation material in the relevant section of the first insulation block 181-1 is at least twice as great as said second concentration of the first implantation material and the relevant section of a second insulation block 181-2. For example, the first concentration and the second concentration of dopants are determined at the same position with respect to the second lateral direction Y and the vertical direction Z.

Regarding all embodiments described herein, some further optional aspects are described in the following:

For example, regarding the optional resist layer 19 that may be used during formation of the semiconductor source region 101, and, in particular, the resist block 191 arranged on top of the insulation block 181 that covers the first trench 14 adjacent to which the semiconductor source regions 101 shall be formed, it shall be noted that the resist block 191 may exhibit a height along the vertical direction Z of at least 500 nm, or of at least 1 µm or of even more than 1.5 µm. The resist block 191 may exhibit a width along the first lateral direction X which is substantially identical to the width of the insulation block 181 arranged underneath the resist block 191. As has been explained above, the width of the resist block 191 and the height of the resist block 191 may be modified so as to influence the position of the semiconductor source region(s) 101. For example, the resist material may be "pulled back", leading to a width of the resist block 191 which is slightly smaller than the width of the underlying insulation block 181, e.g. smaller by up to 200 nm as compared to the width of the underneath insulation block 181. The resist block 191 may in another embodiment exhibit a width slightly greater as compared to the underlying insulation block 181.

Referring to FIG. 18, some exemplary dimensions of an embodiment of the power semiconductor device 1 are presented.

For example, the width WM of the mesa region 105, e.g., defined as the distance along the first lateral direction X between the two trench sidewalls 144, 154 that laterally confine the mesa region 105, e.g. measured at a vertical level where also the source region 101 (not illustrated in FIG. 18) is present, can be within the range of some hundred nm, e.g., wider than 100 nm and smaller than 5 µm, or within the range of 300 nm to 2 µm, e.g., within the range of 400 nm to 1400 nm, such as approximately 600 nm to 800 nm.

The width WH of the contact hole 185 defined by the insulation blocks 181 of the first insulation layer 18 can be about the same size as the mesa width WM, e.g., slightly smaller as the mesa width WM. Hence, the insulation blocks 181 may laterally overlap with the trench insulators 142/152 of the underneath trenches 14/15 and even cover small sections of the mesa region surface 100-5. The contact hole width WH may for example the approximate 450 nm if the mesa width WM amounts to 600 nm.

In the above, embodiments pertaining to power semiconductor switches and corresponding processing methods were explained. For example, these semiconductor devices are based on silicon (Si). Accordingly, a monocrystalline semiconductor region or layer, e.g., the semiconductor body 10 and its regions/zones, e.g., regions etc. can be a monocrystalline Si-region or Si-layer. In other embodiments, polycrystalline or amorphous silicon may be employed.

It should, however, be understood that the semiconductor body 10 and its regions/zones can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The aforementioned semiconductor materials are also referred to as "homojunction semiconductor materials". When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor switchs applications currently mainly Si, SiC, GaAs and GaN materials are used.

Spatially relative terms such as "under", "below", "lower", "over", "upper" and the like, are used for ease of description to explain the positioning of one element relative to a second element. These terms are intended to encompass different orientations of the respective device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising", "exhibiting" and the like are open ended terms that indicate the presence of stated elements or features, but do not preclude additional elements or features.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A power semiconductor device comprising a semiconductor body, the semiconductor body being coupled to a first load terminal and a second load terminal and configured to conduct a load current between the first and second load terminals, wherein the power semiconductor device further comprises:
    a first trench and a second trench that extend from a surface of the semiconductor body along a vertical direction, the first and second trenches laterally confining a mesa region along a first lateral direction;
    a semiconductor source region of a first conductivity type and a semiconductor body region of a second conductivity type both being arranged in the mesa region adjacent to a trench sidewall of the first trench and electrically connected to the first load terminal, wherein the semiconductor source region is based on a first implantation material, and wherein the first trench is configured to induce an inversion channel in the semiconductor body region to control a load current in the mesa region; and
    a first insulation layer arranged above the semiconductor body surface and having a plurality of insulation blocks, two of which laterally confine a contact hole of the first insulation layer,
    wherein the first load terminal extends into the contact hole to contact both the semiconductor source region and the semiconductor body region at a surface of the mesa region,
    wherein a first of the two insulation blocks laterally overlaps with the first trench and a second of the two insulation blocks laterally overlaps with the second trench,
    wherein the first insulation block has a first lateral concentration profile of the first implantation material along the first lateral direction that is different from a second lateral concentration profile of the first implantation material along the first lateral direction present in the second insulation block.

2. The power semiconductor device of claim 1, wherein the first insulation block has a first concentration of the first implantation material that is greater than a second concentration of the first implantation material present in the second insulation block, the first concentration being present in a section of the first insulation block that laterally overlaps with the trench sidewall of the first trench, and the second concentration being present in a section of the second insulation block that laterally overlaps with a trench sidewall of the second trench, the trench sidewalls laterally confining the mesa region.

3. The power semiconductor device of claim 2, wherein the first concentration of the first implantation material is at least twice as great as the second concentration of the first implantation material.

4. The power semiconductor device of claim 1, wherein the semiconductor source region extends for no more than 80% of a width of the mesa region along the first lateral direction.

5. The power semiconductor device of claim 1, wherein the semiconductor source region is arranged adjacent to the trench sidewall of the first trench or a trench sidewall of the second trench, and spatially displaced along the first lateral direction from the other one of the two trench sidewalls.

6. The power semiconductor device of claim 1, wherein the semiconductor source region is arranged adjacent to the trench sidewall of the first trench and to a trench sidewall of the second trench.

7. The power semiconductor device of claim 1, wherein the semiconductor source region is arranged adjacent to the trench sidewall of the first trench and an opposing trench sidewall of the first trench.

8. The power semiconductor device of claim 7, wherein a central subportion of the second conductivity type in the mesa region is laterally displaced from the semiconductor source region and forms a part of the mesa region surface.

9. The power semiconductor device of claim 1, wherein a dopant concentration of the semiconductor body region is increased in a section of the mesa region that is laterally displaced from the semiconductor source region along the first lateral direction.

10. The power semiconductor device of claim 1, wherein the first trench is a control trench having a control electrode configured to induce an inversion channel in the semiconductor body region to control the load current in the mesa region, and wherein the second trench is a source trench having a source electrode.

11. The power semiconductor device of claim 10, wherein the source electrode is electrically connected or coupled to the first load terminal.

12. The power semiconductor device of claim 1, further comprising a contact groove that extends from a level of the semiconductor body surface along the vertical direction into the mesa region, wherein the contact groove electrically connects the first load terminal and the mesa region.

13. The power semiconductor device of claim 12, wherein the contact groove is etched into the semiconductor body and filled with an electrically conductive material.

14. The power semiconductor device of claim 12, wherein the contact groove extends further into the semiconductor body along the vertical direction than the semiconductor source region.

15. The power semiconductor device of claim 1, wherein the first insulation layer has a thickness along the vertical direction of at least 200 nm.

16. The power semiconductor device of claim 1, wherein the first insulation layer comprises a plurality of insulating sublayers.

17. The power semiconductor device of claim 1, wherein the first insulation layer is made of a plurality of different insulating materials.

18. The power semiconductor device of claim 1, wherein a width along the first lateral direction of a part of the mesa region surface exposed by the contact hole is within a range of 50 nm to 500 nm.

19. The power semiconductor device of claim 1, wherein a width along the first lateral direction of a part of the mesa region surface exposed by the contact hole is based on a blocking voltage rating and/or a load current capability of the power semiconductor device.

20. The power semiconductor device of claim 1, wherein the electrical contact between the first load terminal and the mesa region is realized as a flat contact co-planar with the semiconductor body surface.

* * * * *